(12) United States Patent  
Nakamura et al.

(10) Patent No.: US 6,890,600 B2  
(45) Date of Patent: May 10, 2005

(54) SIC SINGLE CRYSTAL, METHOD FOR MANUFACTURING SIC SINGLE CRYSTAL, SIC WAFER HAVING AN EPITAXIAL FILM, METHOD FOR MANUFACTURING SIC WAFER HAVING AN EPITAXIAL FILM, AND SIC ELECTRONIC DEVICE

(75) Inventors: Daisuke Nakamura, Nagoya (JP); Tadashi Ito, Nishikamo-gun (JP); Hiroyuki Kondo, Kariya (JP); Masami Naito, Inazawa (JP)

(73) Assignees: Denso Corporation, Kariya (JP); Kabushiki Kaisha Toyota Chuo Kenkyusho, Aichi-pref (JP)

( * ) Notice: Subject to any disclaimer, the term of this patent is extended or adjusted under 35 U.S.C. 154(b) by 168 days.

(21) Appl. No.: 10/268,103

(22) Filed: Oct. 10, 2002

(65) Prior Publication Data  
US 2003/0070611 A1 Apr. 17, 2003

(30) Foreign Application Priority Data

Oct. 12, 2001 (JP) ........................................ 2001-315367  
Mar. 22, 2002 (JP) ........................................ 2002-080295  
Apr. 30, 2002 (JP) ........................................ 2002-128725

(51) Int. Cl.$^7$ ........................... C30B 25/02; C30B 25/04; C01B 33/26

(52) U.S. Cl. ..................... 427/328.2; 117/84; 117/89; 423/328.2

(58) Field of Search ............................... 117/84, 89, 109

(56) References Cited

U.S. PATENT DOCUMENTS 5,958,132 A      9/1999    Takahashi et al.

FOREIGN PATENT DOCUMENTS

| JP | A-5-262599 | 10/1993 |
| JP | A-8-143396 | 6/1996 |
| JP | H10-182297 | 4/2004 |

*Primary Examiner*—Felisa Hiteshew  
(74) *Attorney, Agent, or Firm*—Posz Law Group, PLC

(57) ABSTRACT

A refined SiC single crystal that includes a small number of defects is provided as follows. At a first growth step, a first seed crystal is formed from a crude SiC single crystal, and a first grown crystal is formed on a first growth surface, which is a plane having an inclination of 20 degrees or smaller from a {1-100} plane or an inclination of 20 degrees or smaller from a {11-20} plane. At an intermediate growth step, an n growth crystal is formed on an n growth surface, which is a plane having an inclination of 45 to 90 degrees from an (n−1) growth surface and an inclination of 60 to 90 degrees from a {0001} plane. At a final growth step, a final SiC single crystal is formed on a final growth surface, which has an inclination of 20 degrees or smaller from a {0001} plane.

44 Claims, 10 Drawing Sheets

US 6,890,600 B2

SIC SINGLE CRYSTAL, METHOD FOR MANUFACTURING SIC SINGLE CRYSTAL, SIC WAFER HAVING AN EPITAXIAL FILM, METHOD FOR MANUFACTURING SIC WAFER HAVING AN EPITAXIAL FILM, AND SIC ELECTRONIC DEVICE

CROSS REFERENCE TO RELATED APPLICATION

This application is based on and incorporates herein by reference Japanese Patent Applications No. 2001-315367 filed on Oct. 12, 2001, No. 2002-80295 filed on Mar. 22, 2002, and No. 2002-128725 filed on Apr. 30, 2002.

BACKGROUND OF THE INVENTION

The present invention relates to an SiC single crystal including a relatively small number of dislocations and defects and a method for manufacturing the SiC single crystal, to an SiC wafer having an epitaxial film and a method for manufacturing the SiC wafer, and to an SiC electronic device, in which the SiC wafer is used.

Nowadays, an SiC semiconductor utilizing an SiC single crystal is expected to become a candidate material for next generation's power device substituting an Si semiconductor. However, according to study reports to date, it is thought that crystal imperfections in the SiC single crystal such as a micropipe defect, a screw dislocation, an edge dislocation, and a stacking fault are the causes of the leak current and the breakdown voltage lowering in the SiC semiconductor. Therefore, it is inevitable to reduce the leak current and suppress the breakdown voltage lowering in order to realize a high performance SiC power device. An SiC wafer with an epitaxial film is particularly used for the power devices. Therefore, an SiC wafer having an epitaxial film that does not include the crystal imperfections not only in the SiC single crystal wafer, on which the epitaxial film is located, but also in the epitaxial film is in high demand.

Incidentally, {1-100}, {11-20}, and {0001} are so-called plane indexes of crystal planes. Although the symbol "-" is conventionally placed on top of numeral in the plane indexes, the symbol is placed at the left side of the numeral in the present specification and drawings for the sake of convenience in document making. <0001>, <11-20>, and <1-100> represent directions in a crystal, and with respect to the directions as well, the symbol "-" is placed in the same manner as in the plane indexes.

An SiC single crystal includes a {0001} plane (c-plane) as a main plane orientation, and also includes a {1-100} plane (a-plane) and a {11-20} plane (a-plane), which are perpendicular to the {0001} plane. Conventionally, as a method to acquire an SiC single crystal, so-called c-plane growth method has been used. In the method, a seed crystal, in which a surface that is a {0001} plane (c-plane) of the hexagonal system or has an inclination smaller than 10 degrees from the {0001} plane is exposed as a seed crystal surface, is used, and an SiC single crystal is grown on the surface by sublimation-reprecipitation technique and so on.

However, the SiC single crystal grown on a c-plane, i.e., grown in a <0001> direction using a {0001} plane as a seed crystal surface includes micropipe defects at a density of $10^0$ to $10^3$ cm$^{-2}$, screw dislocations at a density of $10^3$ to $10^4$ cm$^{-2}$, and edge dislocations at a density of $10^4$ to $10^5$ cm$^{-2}$ in the direction substantially parallel to the <0001> direction. In addition, if an SiC single crystal wafer is produced from the crystal grown on a c-plane and an epitaxial film is deposited on the substrate, the epitaxial film inherits the defects and dislocations that are exposed on the surface of the SiC single crystal wafer. Therefore, dislocations exist in the epitaxial film substantially at the same density as in the SiC single crystal wafer and affect undesirably on a variety of device characteristics.

To address the above problems, a method for acquiring a grown crystal 90 by growing an SiC single crystal on a seed crystal 9 having a seed crystal surface 95, which is an a-plane having an inclination of 60 to 120 degrees (preferably 90 degrees) from a {0001} plane, is disclosed in JP-A-5-262599, as shown in FIG. 6. It turned out that substantially neither micropipe defects nor screw dislocations are included in the crystal 90 grown on the a-plane.

However, the crystal 90 grown on the a-plane includes stacking faults 91 located on {0001} planes at a density as high as $10^2$ to $10^4$ cm$^{-1}$ in the direction substantially parallel to the direction of the crystal growth. Moreover, the crystal 90 includes edge dislocations 92, which have Burger's vectors parallel or perpendicular to a <0001> direction and are substantially parallel to the direction of the crystal growth, at a high density. If an SiC single crystal wafer is produced from the crystal 90 grown on the a-plane and an epitaxial film is deposited on the substrate, the epitaxial film includes dislocations and stacking faults caused by the edge dislocations 92 and stacking faults 91 that are included at a high density in the crystal 90 grown on the a-plane. An SiC power device manufactured from an SiC wafer having the epitaxial film has a relatively high ON resistance and a relatively large leak current in the reverse direction. Therefore, the performance of the device can be undesirably affected.

SUMMARY OF THE INVENTION

The present invention has been made in view of the above aspects. The first object of the present invention is to provide a quality SiC single crystal including a relatively small number of dislocations and defects. The second object of the present invention is to provide a method for manufacturing the quality SiC single crystal. The third object of the present invention is to provide an SiC wafer having an epitaxial film including a relatively small number of dislocations and defects in the SiC single crystal wafer and the epitaxial film. The fourth object of the present invention is to provide a method for manufacturing the SiC wafer having an epitaxial film. The fifth object of the present invention is to provide an SiC electronic device that has a relatively small leak current and a relatively high breakdown voltage.

A first aspect of the present invention is a method for manufacturing an SiC single crystal. The method includes N steps of growth, in which N is a natural number equal to three or greater. When each growth step is expressed in an n growth step, in which n is an ordinal number corresponding to a natural number from one to N, at a first growth step, i.e., at n=1, a first seed crystal is formed such that a plane having an inclination of 20 degrees or smaller from a {1-100} plane or an inclination of 20 degrees or smaller from a {11-20} plane is exposed as a first growth surface, and a first grown crystal is formed by growing an SiC single crystal on the first growth surface.

At an intermediate growth step, i.e., at n=2, 3, . . . , or (N−1), an n seed crystal is formed from an (n−1) grown crystal such that an n growth surface has an inclination of 45 to 90 degrees from an (n−1) growth surface and an inclination of 60 to 90 degrees from a {0001} plane, and an n grown crystal is formed by growing an SiC single crystal on the n growth surface of the n seed crystal. At a final growth step, i.e., at n=N, a final seed crystal is formed from an (N−1) grown crystal such that a plane having an inclination of 20 degrees or smaller from a {0001} plane of the (N−1) grown crystal is exposed as a final growth surface, and a final SiC single crystal is grown on the final growth surface of the final seed crystal.

A second aspect of the present invention is a quality SiC single crystal that is formed by the method described in the first aspect of the present invention. The SiC single crystal includes a relatively small number of micropipe defects, screw dislocations, edge dislocations, and stacking faults.

A third aspect of the present invention is a method for manufacturing an SiC seed crystal for growing an SiC single crystal ingot. The method includes (N−1) steps of growth, in which N is a natural number equal to three or greater, and a step for forming an SiC seed crystal, which is carried out after the (N−1) steps of growth. When each growth step is expressed in an n growth step, in which n is an ordinal number corresponding to a natural number from one to (N−1), at a first growth step, i.e., at n=1, a first seed crystal is formed such that a plane having an inclination of 20 degrees or smaller from a {1-100} plane or an inclination of 20 degrees or smaller from a {11-20} plane is exposed as a first growth surface, and a first grown crystal is formed by growing an SiC single crystal on the first growth surface.

At an intermediate growth step, i.e., at n=2, 3, ..., or (N−1), an n seed crystal is formed from an (n−1) grown crystal such that an n growth surface has an inclination of 45 to 90 degrees from an (n−1) growth surface and an inclination of 60 to 90 degrees from a {0001} plane of the (n−1) grown crystal, and an n grown crystal is formed by growing an SiC single crystal on the n growth surface of the n seed crystal. At the step for forming the SiC seed crystal after the (N−1) steps of growth, a plane having an inclination of 20 degrees or smaller from a {0001} plane of the (N−1) grown crystal is exposed as a final growth surface.

A fourth aspect of the present invention is a quality SiC seed crystal that is formed by the method described in the third aspect of the present invention. The SiC seed crystal is the same crystal as the final seed crystal described in the first aspect. Therefore, the SiC seed crystal includes a relatively small number of micropipe defects, screw dislocations, edge dislocations, and stacking faults Thus, it is possible to provide an quality SiC single crystal using the SiC seed crystal.

A fifth aspect of the present invention is a method for manufacturing an SiC wafer having an epitaxial film. The method includes N steps of growth, in which N is a natural number equal to two or greater and a film deposition step, at which the epitaxial film is deposited. When each growth step is expressed in an n growth step, in which n is an ordinal number corresponding to a natural number from one to N, at a first growth step, i.e., at n=1, a first seed crystal is formed such that a plane having an inclination of 20 degrees or smaller from a {1-100} plane or an inclination of 20 degrees or smaller from a {11-20} plane is exposed as a first growth surface, and a first grown crystal is formed by growing an SiC single crystal on the first growth surface At a sequential growth step, i.e., at n=2, 3, ..., or N, an n seed crystal is formed from an (n−1) grown crystal such that an n growth surface has an inclination of 45 to 90 degrees from an (n−1) growth surface and an inclination of 60 to 90 degrees from a {0001} plane of the (n−1) grown crystal, and an n grown crystal is formed by growing an SiC single crystal on the n growth surface of the n seed crystal.

At the film deposition step, an SiC single crystal wafer having an exposed film deposition surface is formed from an N grown crystal, i.e., n=N, and an epitaxial film is deposited on the film deposition surface of the SiC single crystal wafer. Therefore, it is possible to provide an SiC wafer that includes an SiC single crystal wafer and an epitaxial film, each of which includes a relatively small number of defects and dislocations.

A sixth aspect of the present invention is another method for manufacturing an SiC wafer having an epitaxial film. The method includes (N+α) steps of growth, in which N is a natural number equal to two or greater and α is a natural number, and a film deposition step, at which the epitaxial film is deposited. When each growth step in the steps of growth is expressed in an n growth step, in which n is an ordinal number corresponding to a natural number from one to (N+α), at a first growth step, i.e., at n=1, a first seed crystal is formed such that a plane having an inclination of 20 degrees or smaller from a {1-100} plane or an inclination of 20 degrees or smaller from a {11-20} plane is exposed as a first growth surface, and a first grown crystal is formed by growing an SiC single crystal on the first growth surface.

At a first sequential growth step, i.e., at n=2, 3, ..., or N, an n seed crystal is formed from an (n−1) grown crystal such that an n growth surface has an inclination of 45 to 90 degrees from an (n−1) growth surface and an inclination of 60 to 90 degrees from a {0001} plane of the (n−1) grown crystal, and an n grown crystal is formed by growing an SiC single crystal on the n growth surface of the n seed crystal. At a second sequential growth step, i.e., at n=N+1, N+2, ..., or N+α, an n seed crystal is formed from an (n−1) grown crystal such that an n growth surface has an inclination of 0 to 45 degrees from an (n−1) growth surface and an inclination of 60 to 90 degrees from a {0001} plane of the (n−1) grown crystal, and an n grown crystal is formed by growing an SiC single crystal on the n growth surface of the n seed crystal.

At a film deposition step, an SiC single crystal wafer having an exposed film deposition surface is formed from an (N+α) grown crystal, i.e., n=N+α, and an epitaxial film is deposited on the film deposition surface of the SiC wafer. Therefore, it is possible to provide an SiC wafer that includes an SiC single crystal wafer and an epitaxial film, each of which includes a relatively small number of defects and dislocations as well as the method in the fifth aspect.

A seventh aspect of the present invention is the SiC wafer having an epitaxial film that is formed by the methods described in the fifth and sixth aspects of the present invention. The SiC wafer having the epitaxial film includes a relatively small number of micropipe defects, screw dislocations, edge dislocations, and stacking faults.

An eighth aspect of the present invention is an SiC electronic device that is formed using the SiC wafer having the epitaxial film that is described in the seventh aspect of the present invention. The SiC wafer having the epitaxial film includes a relatively small number of micropipe defects, screw dislocations, and edge dislocations, so the SiC electronic device, in which the SiC wafer is used, also has excellent device characteristics such as relatively low ON resistance and relatively small leak current in the reverse direction.

A ninth aspect of the present invention is a method for manufacturing an SiC single crystal. The method includes N steps of growth, in which N is a natural number equal to two or greater. when each growth step is expressed in an n growth step, in which n is an ordinal number corresponding to a natural number from one to N, at a first growth step, i.e., at n=1, a first seed crystal is formed such that a plane having an inclination of 1 to 90 degrees from a {0001} plane is exposed as a first growth surface, and a first grown crystal is formed by growing an SiC single crystal on the first growth surface.

At a sequential growth step, i.e., at n=2, 3, . . . , or N, when an n inclination direction is defined as the direction of a vector that is made by projecting the normal line vector of an n growth surface onto a {0001} plane of an (n−1) grown crystal, an n seed crystal is formed from an (n−1) grown crystal such that an n growth surface has an n inclination direction that points a direction that is defined by rotating an (n−1) inclination direction by 30 to 150 degrees around a <0001> direction as the rotation axis and has an inclination of 1 to 90 degrees from a {0001} plane of the (n−1) grown crystal. An n grown crystal is formed by growing an SiC single crystal on the n growth surface of the n seed crystal.

A tenth aspect of the present invention is a quality SiC single crystal that is formed by the method described in the ninth aspect of the present invention. The SiC single crystal includes a relatively small number of micropipe defects, screw dislocations, edge dislocations, and stacking faults.

An eleventh aspect of the present invention is a method for manufacturing an SiC wafer having an epitaxial film. In the method, an SiC single crystal wafer is formed from an SiC single crystal described in the tenth aspect such that a film deposition surface is exposed, and an epitaxial film is deposited on the film deposition surface.

A twelfth aspect of the present invention is the SiC wafer having the epitaxial film that is formed by the method described in the eleventh aspect of the present invention. The SiC single crystal described in the tenth aspect includes a relatively small number of micropipe defects, screw dislocations, edge dislocations, and stacking faults, so the SiC wafer having the epitaxial film also includes a relatively small number of micropipe defects, screw dislocations, edge dislocations, and stacking faults.

A thirteenth aspect of the present invention is an SiC electronic device that is formed using the SiC wafer having the epitaxial film that is described in the twelfth aspect of the present invention. The SiC wafer having the epitaxial film includes a relatively small number of micropipe defects, screw dislocations, and edge dislocations. Therefore, the SiC electronic device, in which the SiC wafer is used, has excellent device characteristics such as relatively low ON resistance and relatively small leak current in the reverse direction.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

The present invention will be described in detail with reference to various embodiments.

First Embodiment

Figure 1:
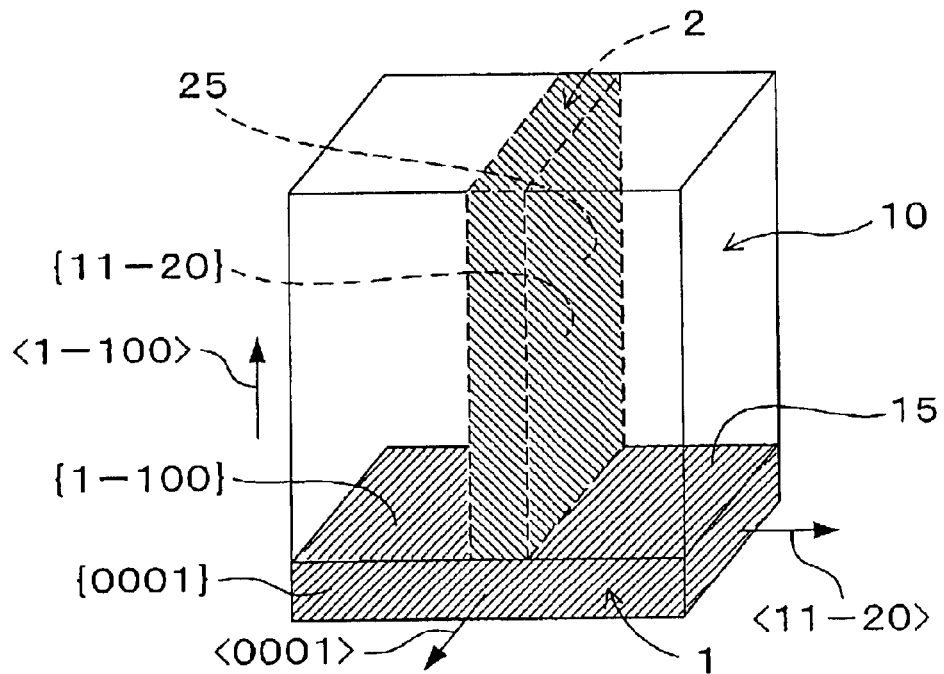
FIG. 1 is a schematic perspective view showing a first growth step of the first to fourth embodiments of the present invention.
Figure 2:
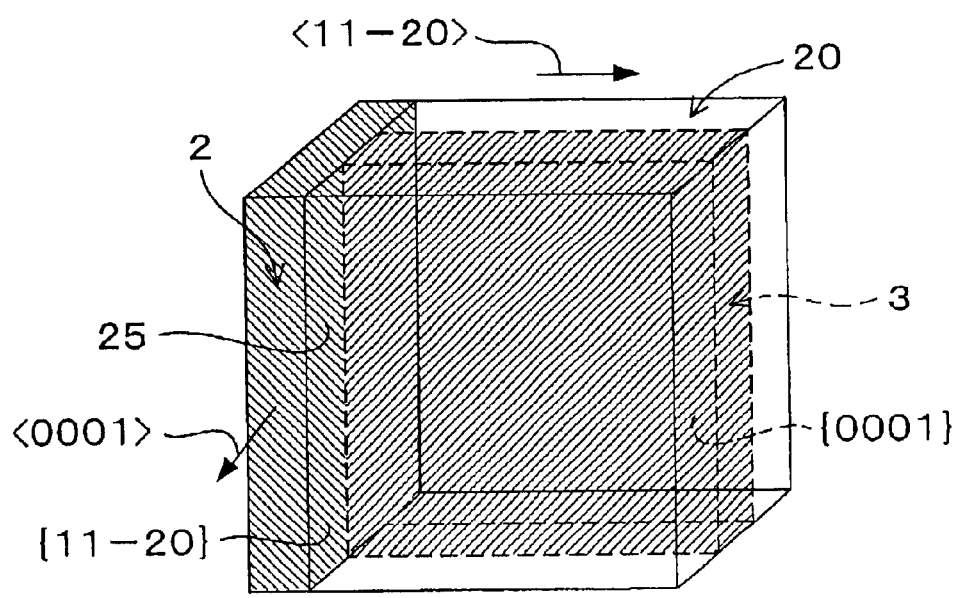
FIG. 2 is a schematic perspective view showing an intermediate growth step of the first to third embodiments.
Figure 3:
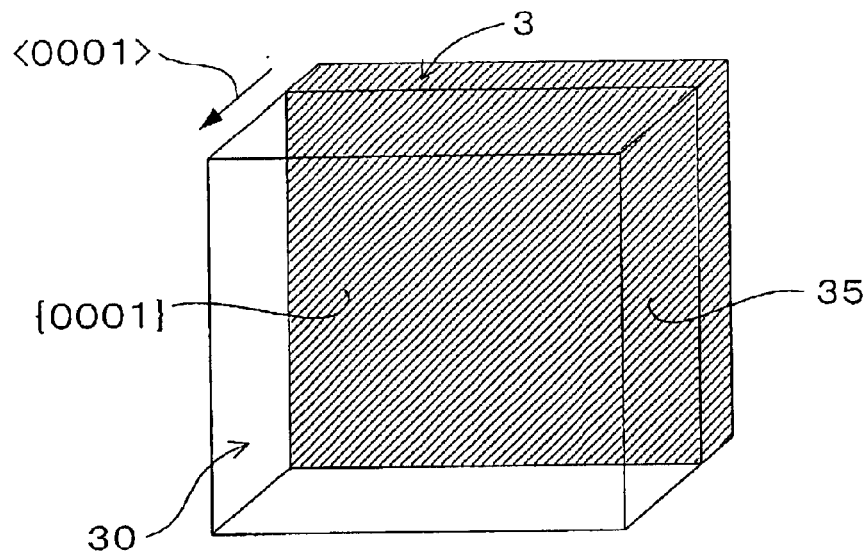
FIG. 3 is a schematic perspective view showing a final growth step of the first to third embodiments.

As shown in FIGS. 1 to 3, a refined SiC single crystal and an SiC seed crystal for making the refined SiC single crystal are formed in a first embodiment. The method for forming the refined SiC single crystal and the seed crystal includes N steps of growth, and each growth step is expressed in an n growth step, in which n is an ordinal number corresponding to a natural number from one to N.

An example of the method, in which N=3, is as follows. As shown in FIG. 1, at a first growth step, i.e., at n=1, a first seed crystal 1, in which a plane having an inclination of 20 degrees or smaller from a {1-100} plane or an inclination of 20 degrees or smaller from a {11-20} plane is exposed as a first growth surface 15, is used, and a first grown crystal 10 is formed by growing an SiC single crystal on the first growth surface 15. The first growth surface 15 is preferably the {1-100} plane or the {11-20} plane. In that case, the first grown crystal 10 is formed in a <1-100> direction or a <11-20> direction, which is a-plane growth. Therefore, it is possible to further effectively reduce piercing defects that are otherwise included in the first grown crystal 10 and oriented in a <0001> direction.

Then, as shown in FIG. 2, at an intermediate growth step that is a second growth step, i.e., at n=2, a second seed crystal 2 is formed such that a second growth surface 25 has an inclination of 45 to 90 degrees from the first growth surface 15 and an inclination of 60 to 90 degrees from a {0001} plane of the first grown crystal 10. Then, a second grown crystal 20 is formed by growing an SiC single crystal on the second growth surface 25 of the second seed crystal 2. It is preferred that the second growth surface 25 has an inclination of 80 to 90 degrees from the first growth surface 15 and an inclination of 80 to 90 degrees from the {0001} plane. In that case, it is possible to further effectively reduce edge dislocations that have a Burger's vector parallel or perpendicular to a <0001> direction of the second grown crystal 20.

Subsequently, as shown in FIG. 3, at a final growth step, i.e., at n=3, a final seed crystal 3 is formed such that a plane having an inclination of 20 degrees or smaller from a {0001} plane of the second grown crystal 20 is exposed as a final growth surface 35, and a final SiC single crystal 30 is grown on the final growth surface 35 of the final seed crystal 3. The final growth surface 35 is preferably the {0001} plane. In that case, it is possible to prevent stacking faults from being generated in the final SiC single crystal 30 because an SiC single crystal is grown in a <0001> direction on the final growth surface 35.

Figure 4:
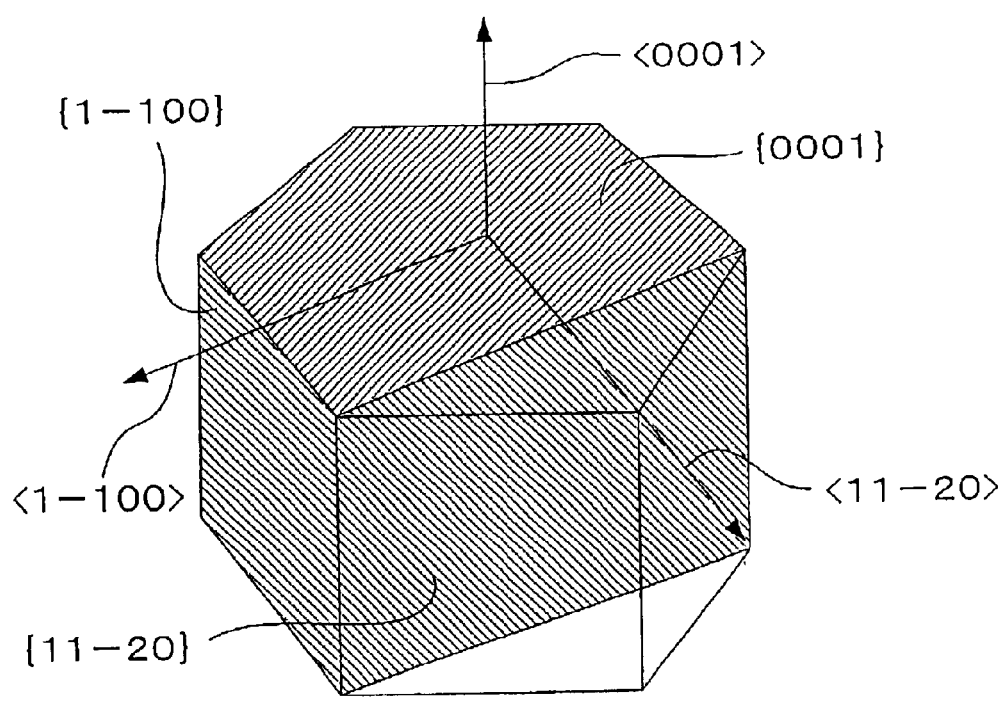
FIG. 4 is a perspective view showing planes and plane directions of an SiC single crystal.

The example of the method will be described in detail. First, a crude SiC single crystal that is formed by sublimation-reprecipitation technique is prepared. As shown in FIG. 4, an SiC single crystal has a {0001} plane, a {1-100} plane, and a {11-20} plane as a main plane. Each of the {1-100} plane and the {11-20} plane is perpendicular to the {0001} plane. A <0001> direction, a <1-100> direction, and a <11-20> direction are the directions perpendicular to the {0001} plane, the {1-100} plane, and the {11-20} plane, respectively. As sown in FIG. 1, the crude SiC single crystal is sawed such that the {1-100} plane of the crude SiC single crystal is exposed as the first growth surface 15. The first growth surface 15 is processed and polished. Next, the first growth surface 15 is chemically cleansed to remove foreign objects, and in-process damaged layers due to the sawing and the polishing are eliminated by Reactive Ion Etching (RIE) and sacrificial oxidization. Then, the first growth surface 15 is thermally etched, and the first seed crystal 1 is formed to have a thickness of 3 mm.

Figure 5:
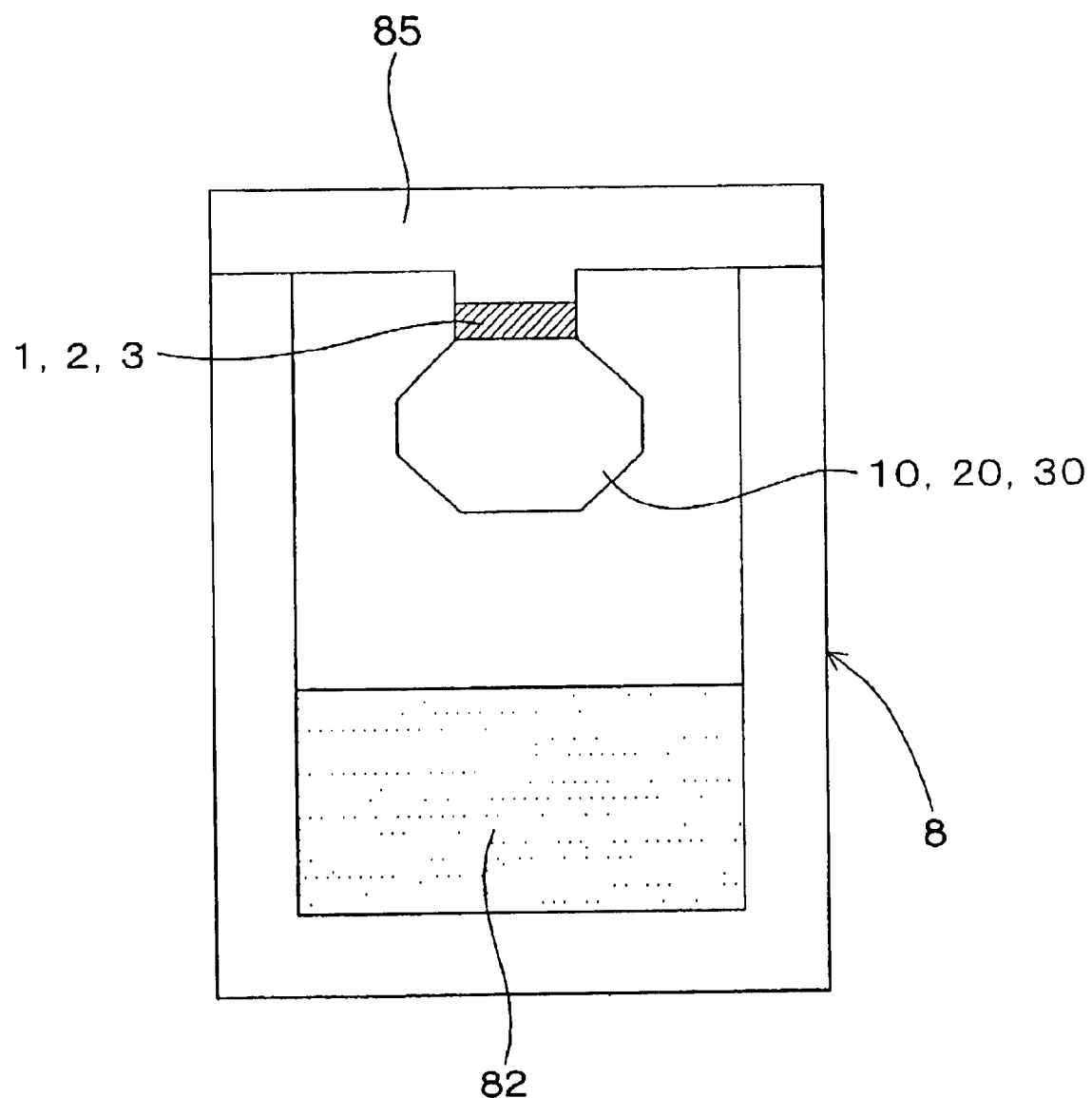
FIG. 5 is cross-sectional view showing the method for forming an SiC single crystal on an SiC seed crystal using sublimation-reprecipitation technique used in the first to fourth embodiments and fourteenth to eighteenth embodiments.
Figure 6:
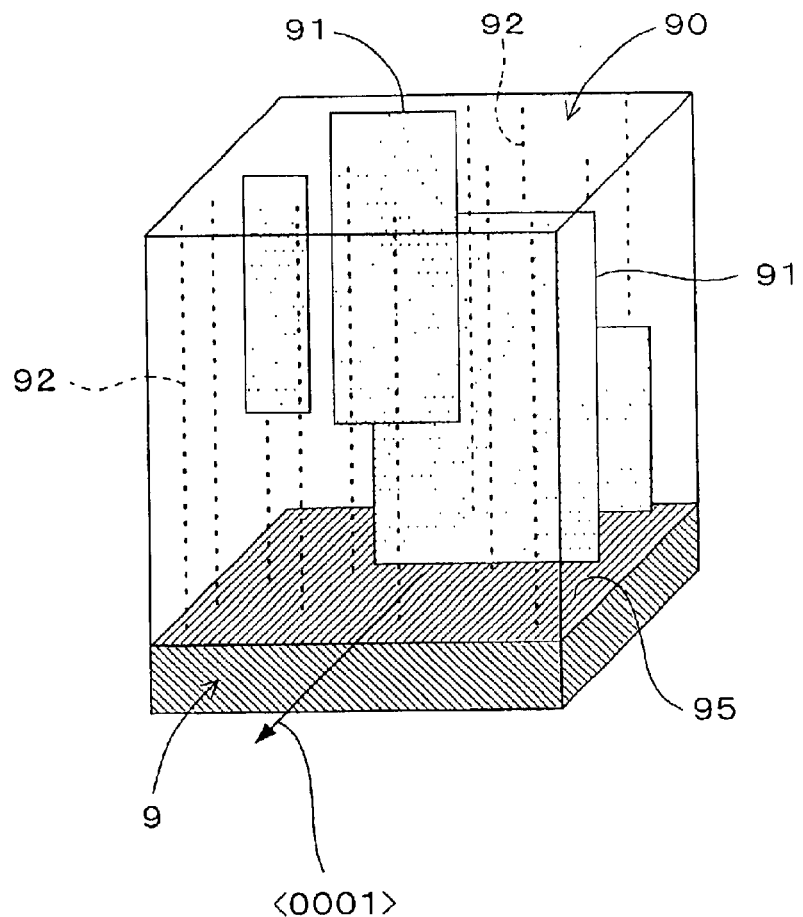
FIG. 6 is a schematic perspective view showing the relation between a-plane growth and each of edge dislocations and stacking faults in a proposed method.

Subsequently, as shown in FIG. 5, the first seed crystal 1 and SiC raw material powder 82 are placed in a crucible 8 such that they confront each other. At that time, the first seed crystal 1 is fixed to the inner surface of the lid 85 of the crucible 8 by an adhesive and so on. Then, the crucible 8 is heated at 2100 to 2400° C. in an inert low pressure atmosphere. At that time, the temperature of the SiC raw material powder 82 is set to be higher than that of the first seed crystal 1 by 20 to 200° C., so the SiC raw material powder 82 in the crucible 8 is sublimed by the heating and deposited on the first seed crystal 1 colder than the SiC raw material powder 82 to make the first grown crystal 10.

Then, as shown in FIGS. 1 and 2, the second seed crystal 2 is formed in the same manner as the first seed crystal 1 such that the second growth surface 25 is a {11-20} plane, which has an inclination of 90 degrees from the first growth surface 15 and a {0001} plane. Then the second seed crystal 2 is grown in the same manner as the first seed crystal 1 to acquire the second grown crystal 20.

Next, as shown in FIGS. 2 and 3, the final seed crystal 3 (third seed crystal), in which a {0001} plane of the second grown crystal 20 is the final growth surface 35 (third growth surface), is formed in the same manner as the first seed crystal 1 and the second seed crystal 2. Then, the final SiC single crystal 30 is formed by growing an SiC single crystal on the final growth surface 35 of the final seed crystal 3.

At the first growth step of the example of the method, a {1-100} plane is used as the first growth surface 15. Therefore, the first grown crystal 10 is formed in the direction perpendicular to the first growth surface 15, and this is so-called a-plane growth. Thus, substantially neither micropipe defects nor screw dislocations are newly generated in the first grown crystal 10. However, micropipe defects, screw dislocations, edge dislocations, and the complex dislocations between them exist in the first seed crystal 1. Therefore, edge dislocations having a Burger's vector parallel or perpendicular to a <0001> direction are inherited from the first growth surface 15 and exist in the first growth crystal 10. The edge dislocations exist to extend in the direction parallel to the direction of the growth of the first grown crystal 10.

At the intermediate growth step, the second seed crystal 2 is formed such that the second growth surface 25 is a {11-20} plane, which has an inclination of 90 degrees from the first growth surface 15 and a {0001} plane of the first growth crystal 10. Therefore, edge dislocations that exist in the first grown crystal 10 are hardly exposed on the second growth surface 25 of the second seed crystal 2, so almost all edge dislocations otherwise inherited from the second seed crystal 2 are excluded from the second grown crystal 20 when an SiC single crystal is grown on the second growth surface 25. Moreover, the second seed crystal 2 is grown substantially in the direction of the a-plane growth at the intermediate growth step. Thus, substantially neither micropipe defects nor screw dislocations are newly generated in the second grown crystal 20. However, at the intermediate growth step, the second seed crystal 2 is grown substantially in the direction of the a-plane, so it is inevitable that stacking faults, which is unique to a crystal grown on the a-plane, are generated.

At the final growth step, the final seed crystal 3, in which a {0001} plane of the second growth crystal 20 is exposed as the final growth surface 35, is formed. Therefore, a relatively small number of edge dislocations having a Burger's vector parallel or perpendicular to a <0001> direction exposed on the final growth surface 35. Thus, edge dislocations having a Burger's vector perpendicular to a <0001> direction are not generated in the final SiC single crystal 30. In addition, substantially neither micropipe defects, which are defects having a Burger's vector parallel to the <0001> direction, nor screw dislocations, which are dislocatios having a Burger's vector parallel to the <0001> direction, are generated in the final SiC single crystal 30. In addition, at the final growth step, an SiC single crystal is grown on the final growth surface 35 in the <0001> direction. Therefore, a relatively small number of stacking faults, which are densely included in the final seed crystal 3, are generated in the final SiC single crystal 30. The reason is that substantially no stacking faults are inherited in the growth in a <0001> direction.

In addition, in the example of the method, foreign objects and in-process damaged layers are eliminated before each SiC single crystal is formed on the first growth surface 15, the second growth surface 25, and the final growth surface 35. Therefore, it is possible to prevent dislocations from being caused in each grown crystal 10, 20 and the final SiC single crystal 30 by the foreign objects and the in-process damaged layers. For example, polishing, chemical cleansing, RIE, and sacrificial oxidization may be used as the method for eliminating the sticking foreign objects and the in-process damaged layers.

At the first growth step and the intermediate growth step, it is preferred that each surface of the seed crystals 1, 2 be thermally etched. That way, it is possible to further prevent dislocations from being caused in each grown crystal 10, 20 by the foreign objects and the in-process damaged layers located on each growth surface 15, 25. It is preferred that the thermal etching is carried out at a growth temperature or at a temperature within ±400° C. from the growth temperature. Alternatively, each surface of the seed crystals 1, 2 is etched by introducing an etching gas into a container used for a growth. The etching gas may be, for example, $H_2$ or HCl.

It is preferred that sublimation-reprecipitation technique be used for growing each SiC single crystal 10, 20, 30 on each seed crystal 1, 2, 3 in the first embodiment. In that case, sufficient growth height is acquired, so an SiC single crystal and an SiC seed crystal with a large diameter can be manufactured.

In the example of the method, each of the first seed crystal 1, the intermediate seed crystal 2, and the final seed crystal 3 has a thickness of 1 mm or greater. Therefore, it is possible to prevent the dislocations from being generated in the grown crystal 10, 20, 30 due to the stress caused by the difference in thermal expansion between each seed crystal 1, 2, 3 and the lid 85 that contacts the seed crystal. That is to say, it is possible to prevent the stress from distorting the lattices making up the seed crystals 1, 2, 3 and generating the dislocations in a grown crystal by thickening sufficiently the seed crystals 1, 2, 3. Especially in the case that the growth surfaces 15, 25, 35 of the seed crystals 1, 2, 3 have an area A greater than 500 mm², the seed crystals 1, 2, 3 need to be much thicker than 1 mm. The minimum thickness $t_{seed}$ needed is provided by the equation, $t_{seed}=A^{1/2} \times 2/\pi$. In the equation, the symbol $\pi$ is the circular constant.

As described, the final seed crystal 3 includes neither micropipe defects nor screw dislocations. In addition, a relatively small number of dislocations having a Burger's vector parallel or perpendicular to a <0001> direction are exposed on the growth surface 35 of the SiC seed crystal 3. The SiC seed crystal 3 is formed such that a plane having an inclination of 20 degrees or smaller from a {0001} plane is exposed as the final growth surface 35 to grow an SiC single crystal on the final growth surface 35 substantially in a <0001> direction. Therefore, the final SiC single crystal 30, which is acquired by growing an SiC single crystal on the final growth surface 35 of the SiC seed crystal 3, includes a relatively small number of stacking faults. Thus, according to the method of the first embodiment, it is also possible to provide a quality SiC seed crystal, which includes a relatively small number of micropipe defects, screw dislocations, edge dislocations, and stacking faults, for forming a quality SiC single crystal. In addition, once the seed crystal is prepared, similar seed crystals can be repeatedly formed, so it is possible to manufacture readily and massively the quality defects-free SiC single crystal.

Moreover, another seed crystal (duplication seed crystal), in which a plane having an inclination of 20 degrees or smaller from a {0001} plane of the SiC single crystal 30 formed at the final growth step is exposed as another growth surface (duplication growth surface), can be formed by sawing the single crystal 30, and another SiC single crystal (duplicated single crystal) can be formed using the another seed crystal. Therefore, it is possible to duplicate an SiC single crystal having as high quality as the final SiC single crystal 30 using the another seed crystal. In addition, an SiC single crystal that has as high quality as the final SiC single crystal can be duplicated again and again by repeating the formation of a seed crystal by sawing an SiC single crystal and the growth of the seed crystal in the same manner as described above.

Thus, according to the method of the first embodiment, it is possible to provide a quality SiC single crystal including a relatively small number of micropipe defects, screw dislocations, edge dislocations, and stacking faults and a method for manufacturing the SiC single crystal, and it is also possible to provide a quality SiC seed crystal including a relatively small number of micropipe defects, screw dislocations, edge dislocations, and stacking faults and a method for manufacturing the SiC seed crystal. The SiC single crystal is significantly beneficial as a material for the next generation power device.

In the example of the method, the intermediate growth step is carried out only one, i.e., N=3. However, it may be carried out repeatedly as follows. The second grown crystal 20 is formed using a {11-20} plane as the second growth surface 25 at the intermediate growth step. Then, a {1-100} plane, which is a plane having an inclination of 90 degrees from the second growth surface 25 and a {0001} plane, is formed as a third growth surface of a third growth step from the second grown crystal 20. Next, a third grown crystal is formed by growing an SiC single crystal on the third growth surface. Similarly, the intermediate growth step may be carried out repeatedly from the third grown crystal in sequence, a fourth growth step, a fifth growth step, . . . , and an (N−1) step. As the number of the intermediate growth steps is increased, so-called dislocation density of an acquired grown crystal decreases exponentially.

Second Embodiment

A second embodiment is a method for forming a refined SiC single crystal and an SiC seed crystal that is used to make the refined SiC single crystal. The method includes an intermediate growth step, at which a {0001}-plane growth is carried out, in addition to the first growth step, the intermediate growth step, and the final growth step described in the first embodiment. Specifically, at the intermediate growth step including the {0001}-plane growth, an n seed crystal is formed such that a plane having an inclination of 20 degrees or smaller from a {0001} plane of an (n−1) crystal is exposed as an n growth surface, and an SiC single crystal is grown on the n growth surface.

An example of the method is as follows. A first growth step is carried out in the same manner as described in the first embodiment. Then, a second seed crystal 2 is formed at a second growth step such that a second growth surface 25 is a {11-20} plane, which has an inclination of 90 degrees from a first growth surface 15 and a {0001} plane of a first grown crystal 10. Then, a second grown crystal 20 is formed by growing an SiC single crystal on the second growth surface 25. Next, a third seed crystal, in which a {0001} plane of the second grown crystal 20 is a third growth surface, is formed at a third growth step, in which a {0001}-plane growth is carried out. Then, a third growth crystal is formed by growing an SiC single crystal on the third growth surface. Then, a fourth seed crystal is formed at a fourth growth step such that a fourth growth surface is a {1-100} plane, which has an inclination of 90 degrees from a {0001} plane of the third grown crystal. Then, a fourth grown crystal is formed by growing an SiC single crystal on the fourth growth surface.

Another example is as follows. After a first growth step is carried out in the same manner as described in the first embodiment, a second seed crystal is formed such that a {0001} plane of a first grown crystal 10 is exposed as a second growth surface at a second growth step, in which a {0001}-plane growth is carried out. Then, a second growth crystal is formed by growing an SiC single crystal on the second growth surface. Then, a third seed crystal is formed at a third growth step such that a {11-20} plane, which has an inclination of 90 degrees from a {0001} plane of the second grown crystal, is exposed as a third growth surface. Afterward, a third grown crystal is formed by growing an SiC single crystal on the third growth surface.

According to the method of second embodiment as well, it is possible to provide a quality SiC single crystal including a relatively small number of micropipe defects, screw dislocations, edge dislocations, and stacking faults and a method for manufacturing the SiC single crystal. It is also possible to provide a quality SiC seed crystal including a relatively small number of micropipe defects, screw dislocations, edge dislocations, and stacking faults and a method for manufacturing the SiC seed crystal.

Third Embodiment

A third embodiment is the same as the first embodiment except that each SiC single crystal 10, 20, 30 is grown on each growth surface 15, 25, 35 by a chemical vapor deposition (CVD). In the first embodiment, sublimation-reprecipitation technique is used for growing an SiC single crystal on each seed crystal. However, the method that can be used for growing the SiC single crystal in the present invention is not limited to sublimation-reprecipitation technique. Any method that enables to grow a single crystal ingot with sufficient growth height may be applied. In the third embodiment, each SiC single crystal 10, 20, 30 is grown on each growth surface 15, 25, 35 by a CVD, in which a mixture of silane ($SiH_4$) gas and propane ($C_3H_8$) gas is used as a raw material gas containing silicon (Si) and carbon (C).

With a growth using the CVD, it is possible to provide a quality SiC single crystal that includes a relatively small number of micropipe defects, dislocations, and so on. In addition, the raw material gas can be continuously supplied, so it is possible to avoid running out of the material gas during a growth. Therefore, a sufficient growth height is acquired, so the growth using a CVD has an advantage in reducing manufacturing costs. For example, an SiC single crystal with a length longer than 50 mm in the direction of growth can be grown with one growth step using the CVD, and an SiC wafer with a large diameter can also be formed by sawing the SiC single crystal. With respect to a CVD, a detailed description is made in Mater. Sci. Eng. B Vol. 61–62 (1999) 113–120 and so on.

Fourth Embodiment

Figure 7:
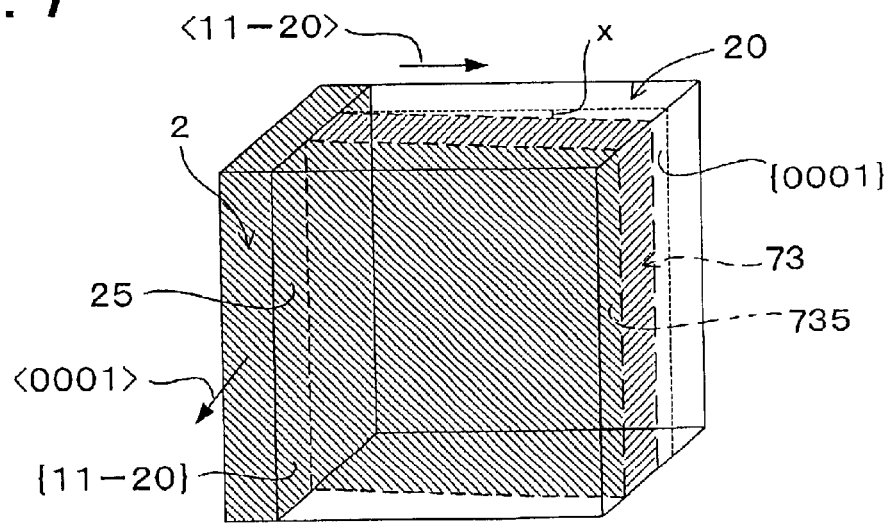
FIG. 7 is a schematic perspective view showing a sequential growth step of the fourth embodiment.
Figure 8:
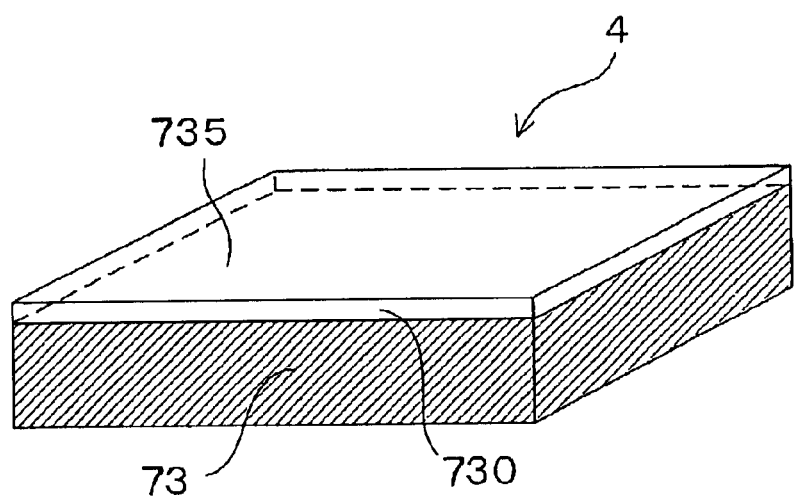
FIG. 8 is a schematic perspective view showing a film deposition growth step of the fourth, fifth, and eighteenth embodiments.

As shown in FIGS. 1, 7, and 8, an SiC wafer having an epitaxial film is formed in a fourth embodiment. In the manufacturing method of the fourth embodiment, an ingot of SiC single crystal is formed by repeating a step of growing an SiC single crystal on an SiC seed crystal. Then, an SiC single crystal wafer is formed from the ingot. Finally, the SiC wafer having an epitaxial film is formed by depositing an epitaxial film on the SiC single crystal wafer. Specifically, the method includes N steps of growth, in which N is a natural number equal to two or greater. After the steps of growth, an epitaxial film is deposited at a film deposition step. In the fourth embodiment, each growth step is expressed in an n growth step, in which n is an ordinal number corresponding to a natural number from one to N.

An example of the method, in which N=2, is as follows. As shown in FIG. 1, at a first growth step, i.e., at n=1, a first seed crystal 1 is formed from a crude SiC single crystal such that a plane having an inclination of 20 degrees or smaller from a {1-100} plane or a {11-20} plane of the crude SiC single crystal is exposed as a first growth surface 15, and a first grown crystal 10 is formed by growing an SiC single crystal on the first growth surface 15. The first growth surface 15 is preferably the {1-100} plane or the {11-20} plane. In that case, the first grown crystal 10 is formed in a <1-100> direction or a <11-20> direction, which is a-plane growth. Therefore, it is possible to further effectively reduce piercing defects that are included in the first grown crystal 10 and oriented in a <0001> direction.

Then, as shown in FIGS. 1 and 7, at a sequential growth step that is a second growth step, i.e., at n=2, a second seed crystal 2 is formed from the first grown crystal 10 such that a second growth surface 25 has an inclination of 45 to 90 degrees from the first growth surface 15 and an inclination of 60 to 90 degrees from a {0001} plane of the first grown crystal 10. Then, a second grown crystal 20 is formed by growing an SiC single crystal on the second growth surface 25 of the second seed crystal 2. It is preferred that the second growth surface 25 has an inclination of 80 to 90 degrees from the first growth surface 15 and an inclination of 80 to 90 degrees from the {0001} plane. In that case, it is possible to further effectively reduce edge dislocations that have a Burger's vector parallel or perpendicular to a <0001> direction in the second grown crystal 20.

Then, as shown in FIGS. 7 and 8, at a film deposition step, an SiC single crystal wafer 73 having an exposed film deposition surface 735 is formed from the second grown crystal 20, and an epitaxial film 730 is deposited on the film deposition surface 735 of the SiC single crystal wafer 73 to form an SiC wafer 4 having an epitaxial film. It is preferred that the film deposition surface 735 have an inclination of 0.2 to 20 degrees from a {0001} plane of the second grown crystal 20, have an inclination of 20 degrees or smaller from a {1-100} plane of the second grown crystal 20, or have an inclination of 20 degrees or smaller from a {11-20} plane of the second grown crystal 20. In that case, it is possible to suppress the generation of micropipe defects, screw dislocations, and edge dislocations in the epitaxial film 730. In the case that the film deposition surface 735 has an inclination smaller than 0.2 degrees from the {0001} plane, the deposition of the epitaxial film 730 might become difficult.

The example of the method will be described in detail. A first seed crystal 1, which has a first growth surface 15, a first grown crystal 10, a second seed crystal 2, which has a second growth surface 25, and a second grown crystal 20 are formed in the same manner as described in the first embodiment. Then, as shown in FIGS. 7 and 8, an SiC single crystal wafer 73 is formed by sawing the second grown crystal 20 such that a plane having an inclination of x degrees from a {0001} plane of the second grown crystal 20 is exposed as a film deposition surface 735. The film deposition surface 735 is treated with surface treatments such as polishing, chemical cleansing, RIE, and sacrificial oxidization in the same manner as the first seed crystal 1 in the first embodiment. Subsequently, an SiC wafer 4 having an epitaxial film is formed by depositing an epitaxial film 730 on the film deposition surface 735 of the SiC single crystal wafer 73 using CVD.

Specifically, the deposition is carried out while $SiH_4$ gas and $C_3H_8$ gas, which are raw material gases, and $H_2$ gas, which is a carrier gas, are respectively being introduced into a reaction tube at 5 ml/min, 5 mil/min, and 10 l/min and while the temperature of a susceptor holding the SiC single crystal wafer 73 is being retained at 1550° C. The inclination angle x and the atmosphere pressure during the deposition are 5 degrees and 30 kPa, respectively.

The density of the defects contained in the epitaxial film 730 of the SiC wafer 4 was measured as follows. The epitaxial film 730 was etched with molten KOH, and the number of etch pits generated by the etching was counted. It turned out that the number of etch pits corresponding to dislocations is as small as $10^2$ to $10^3/cm^2$.

At the first growth step of the example of the method, a {1-100} surface is used as the first growth surface 15. Therefore, the first grown crystal 10 is formed in the direction perpendicular to the first growth surface 15, and this is so-called a-plane growth. Thus, substantially neither micropipe defects nor screw dislocations are newly generated in the first grown crystal 10. However, micropipe defects, screw dislocations, edge dislocations, and the complex dislocations between them exist in the first seed crystal 1. Therefore, edge dislocations having a Burger's vector parallel or perpendicular to a <0001> direction are inherited from the first growth surface 15 and exist in the first growth crystal 10. The edge dislocations exist to extend in the direction parallel to the direction of the growth of the first grown crystal 10.

At the sequential growth step, the second seed crystal 2 is formed such that the second growth surface 25 is a {11-20} plane of the first grown crystal 10, which has an inclination of 90 degrees from the first growth surface 15 and a {0001} plane of the first grown crystal 10. Therefore, edge dislocations that exist in the first grown crystal 10 are hardly exposed on the second growth surface 25, so almost all edge dislocations otherwise inherited from the second seed crystal 2 are excluded from the second grown crystal 20 when an SiC single crystal is grown on the second growth surface 25. Moreover, the second seed crystal 2 is grown substantially in the direction of a-plane growth at the intermediate growth step. Thus, substantially neither micropipe defects nor screw dislocations are generated in the second grown crystal 20. Stacking faults can be generated at the first and second growth step because each step is a-plane growth. However, the number of stacking faults can be decreased by sufficiently thickening the first and second seed crystals 1, 2 because the strain is reduced in the crystals 1, 2 during the a-plane growth.

At the film deposition step, the SiC single crystal wafer 73 is formed such that a plane having an inclination of 5 degrees from a {0001} plane of the second growth crystal 20 is exposed as the film deposition surface 735. Therefore, a relatively small number of edge dislocations, each of which has a Burger's vector parallel or perpendicular to a <0001> direction of the second growth crystal 20, are exposed on the film deposition surface 735. Thus, substantially no edge dislocations, each of which has a Burger's vector perpendicular to a <0001> direction of the epitaxial film 730, are generated in the epitaxial film 730. In addition, substantially neither micropipe defects nor screw dislocations, each of which has a Burger's vector parallel to the <0001> direction of the epitaxial film 730, are generated in the epitaxial film 730.

In the example of the method, foreign objects and in-process damaged layers are eliminated before an SiC single crystal is formed on the first growth surface 15, the second growth surface 25, and the film deposition surface 735. Therefore, it is possible to prevent dislocations from being caused in each grown crystal 10, 20 and the epitaxial film 730 by the foreign objects and the in-process damaged layers.

It is preferred the epitaxial film 730 contain an impurity at a concentration of $1 \times 10^{13}$ to $1 \times 10^{20}/cm^3$. In that case, the impurity functions as a donor or acceptor, and the SiC wafer 4 having the epitaxial film 730 can be used for a semiconductor device and so on. In the case that the concentration of the impurity is lower than $1 \times 10^{13}/cm^3$, the impurity is not able to supply sufficient carriers, so the device characteristics of the SiC wafer 4 having the epitaxial film 730 might become unacceptable. On the other hand, in the case that the concentration of the impurity is higher than $1 \times 10^{20}/cm^3$, the impurity condenses, and as a result, dislocations and stacked faults might be generated in the epitaxial film 730. It is preferred that the impurity consist of one element or more of nitrogen, boron, and aluminum. In that case, it is possible to make the epitaxial film 730 become a p-type or n-type semiconductor, so the SiC wafer 4 having the epitaxial film 730 can be used for a semiconductor device such as a diode.

According to the method of the fourth embodiment, it is possible to provide a quality SiC wafer having an epitaxial film including a relatively small number of micropipe defects, screw dislocations, edge dislocations, and stacking faults and a method for manufacturing the SiC wafer. The SiC wafer having an epitaxial film is significantly beneficial as a material for, for example, the next generation power device.

In the example of the method, the sequential growth step is carried out only one, i.e., N=2. However, it may be carried out repeatedly as follows. A second grown crystal 20 is formed using a {11-20} plane of a first growth crystal 10 as a second growth surface 25 at a first sequential growth step. Then, a {1-100} plane, which has an inclination of 90 degrees from the second growth surface 25 and a {0001} plane of the second grown crystal 20, is exposed as a third growth surface at a third growth step. Next, a third grown crystal is formed by growing an Sic single crystal on the third growth surface. Similarly, the sequential growth step may be carried out repeatedly from the third grown crystal in sequence, a fourth growth step, a fifth growth step, . . . , and an (N−1) step. As the number of the sequential growth steps is increased, so-called dislocation density of an acquired grown crystal decreases exponentially.

Fifth Embodiment

As shown in FIGS. 8, 9 to 11, an SiC wafer having an epitaxial film is formed in a fifth embodiment. In the manufacturing method of the fifth embodiment, as well as the fourth embodiment, an ingot of SiC single crystal is formed by repeating a step of growing an SiC single crystal on an SiC seed crystal. Then, an SiC single crystal wafer is formed from the ingot. Finally, the SiC wafer having an epitaxial film is formed by depositing an epitaxial film on the SiC single crystal wafer. Specifically, the method includes (N+α) steps of growth, in which N is a natural number equal to two or greater and a is a natural number. After the steps of growth, an epitaxial film is deposited at a film deposition step. Each growth step is expressed in an n growth step, in which n is an ordinal number corresponding to a natural number from one to (N+α).

Figure 9:
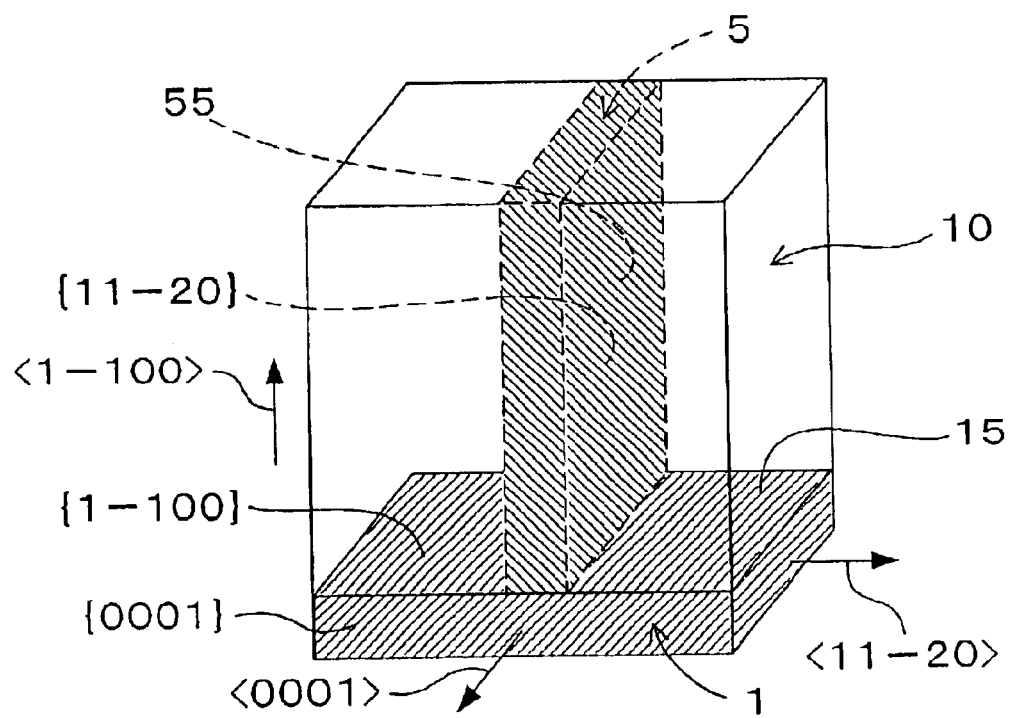
FIG. 9 is a schematic perspective view showing a first growth step of the fifth embodiments.
Figure 10:
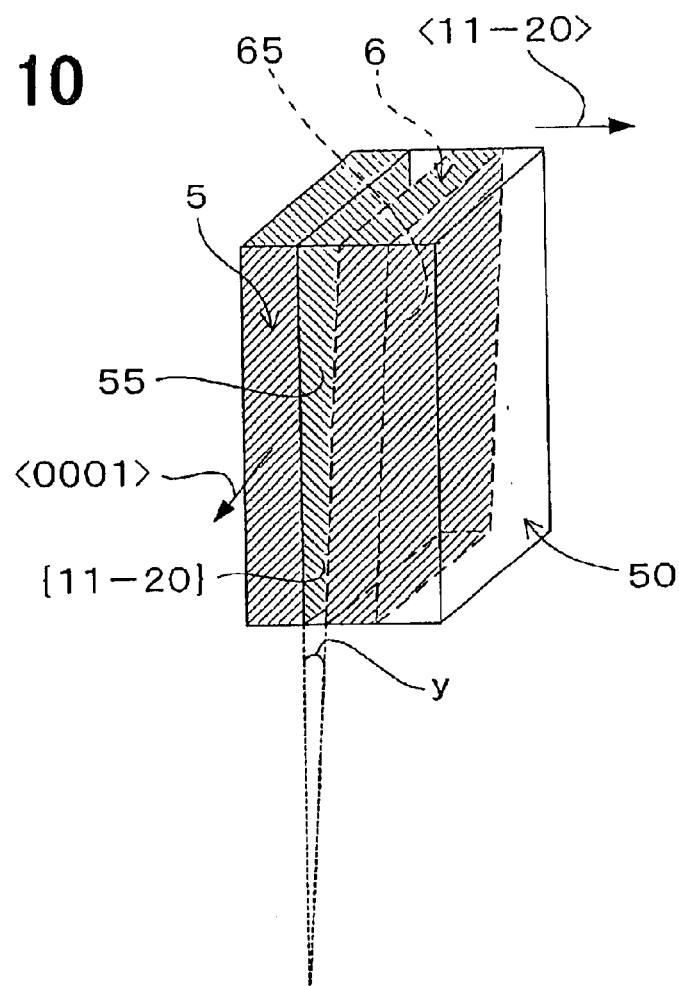
FIG. 10 is a schematic perspective view showing a first sequential growth step of the fifth embodiment.

An example of the method, in which N=2 and α=1, is as follows. As shown in FIG. 9, at a first growth step, i.e., at n=1, a first seed crystal 1 is formed from a crude SiC single crystal such that a plane having an inclination of 20 degrees or smaller from a {1-100} plane of the crude SiC single crystal is exposed as a first growth surface 15, and a first grown crystal 10 is formed by growing an SiC single crystal on the first growth surface 15 in the same manner as the first embodiment. Then, as shown in FIGS. 9 and 10, at a first sequential growth step, which is a second growth step, i.e., at n=2, a second seed crystal 5 is formed from the first grown crystal 10 such that a second growth surface 55 has an inclination of 45 to 90 degrees from the first growth surface 15 and an inclination of 60 to 90 degrees from a {0001} plane of the first grown crystal 10. Then, a second grown crystal 50 is formed by growing an SiC single crystal on the second growth surface 55 of the second seed crystal 5 in the same manner as the first embodiment.

Figure 11:
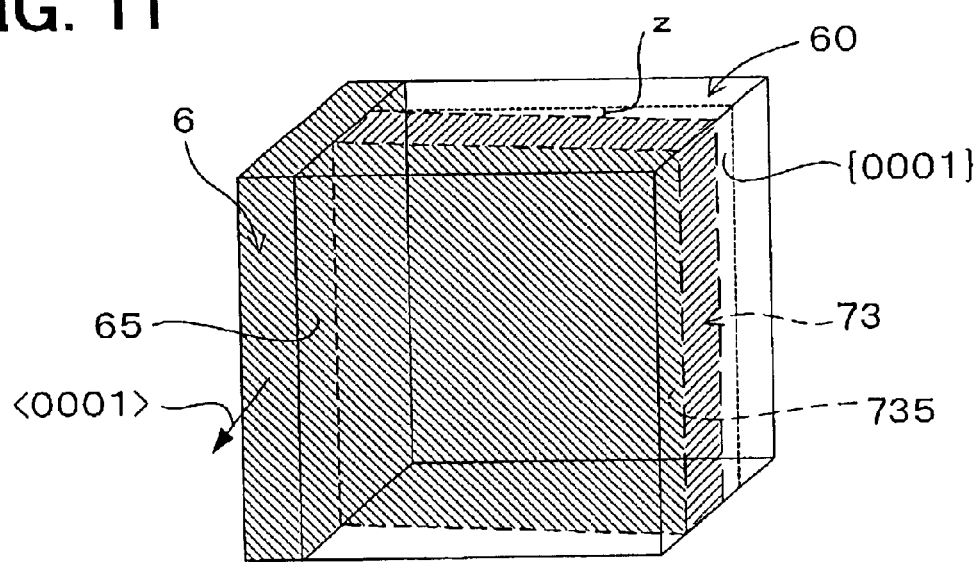
FIG. 11 is a schematic perspective view showing a second sequential growth step of the fifth embodiment.

Then, as shown in FIGS. 10 and 11, at a second sequential growth step, which is a third growth step, i.e., at n=3, a third seed crystal 6 is formed from the second grown crystal 50 such that a third growth surface 65 has an inclination of 0 to 45 degrees from the second growth surface 55 and an inclination of 60 to 90 degrees from a {0001} plane of the second grown crystal 50. Next, a third grown crystal 60 is formed by growing an SiC single crystal on the second growth surface 55 of the second seed crystal 5. Then, as shown in FIGS. 8 and 11, at a film deposition step, an SiC single crystal wafer 73 having an exposed film deposition surface 735 is formed from the third grown crystal 60, and an epitaxial film 730 is deposited on the film deposition surface 735 of the SiC single crystal wafer 73.

The example of the method will be described in detail. First, an SiC single crystal is formed by sublimation-reprecipitation technique. The SiC single crystal is sawed such that a {1-100} plane of the SiC single crystal is exposed as a first growth surface 15, and a first seed crystal 1, which has a thickness of 3 mm, is formed in the same manner as the first embodiment. A first growth crystal 10 is formed by growing an SiC single crystal on the first seed crystal 1 using SiC raw material powder in the same manner as the first embodiment.

Then, as shown in FIGS. 9 and 10, a second seed crystal 5 is formed in the same manner as the first embodiment such that a second growth surface 55 is a {11-20} plane, which has an inclination of 90 degrees from the first growth surface 15 and a {0001} plane of the first growth crystal 10. Then, an SiC single crystal is grown on the second growth surface 55 in the same manner as the first grown crystal 10 to form a second grown crystal 50. The second grown crystal 50 is formed to have an approximately half length of the first grown crystal 10.

Then, as shown in FIGS. 10 and 11, a third seed crystal 6 is formed from the second grown crystal 50 in the same manner as the first and second seed crystals 1, 5 such that a third growth surface 65 has an inclination of y degrees from the second growth surface 55 and an inclination of 90 degrees from a {0001} plane of the second grown crystal 50. Then, an SiC single crystal is grown on the third growth surface 65 in the same manner as the first and second grown crystals 10, 50 to form a third grown crystal 60. The inclination angle y can be arbitrarily determined in a range between 0 and 45 degrees, and the angle y is 0 degree in the fifth embodiment.

Subsequently, as shown in FIGS. 8 and 11, a SiC single crystal wafer 73 is formed by sawing the third grown crystal 60 such that a plane having an inclination of z degrees from a {0001} plane of the third grown crystal 60 is exposed as a film deposition surface 735. Then, an epitaxial film 730 is deposited on the film deposition surface 735 of the SiC single crystal wafer 73 in the same manner as the fourth embodiment to form an SiC wafer 4 having an epitaxial film. The offset angle z is 5 degrees in the fifth embodiment.

The density of the defects contained in the epitaxial film 730 of the SiC wafer 4 was measured in the same manner as in the first embodiment. It turned out that the epitaxial film 730 formed in the fifth embodiment has as small number of etch pit corresponding to dislocations as that of the SiC wafer 4 formed in the first embodiment. According to the manufacturing method of the fifth embodiment as well, it is possible to provide an SiC wafer having an epitaxial film that includes a relatively small number of dislocations and defects.

At the second sequential growth step, the third growth surface 65 has an inclination of 0 degrees from the second growth surface 55, that is, parallel to the second growth surface 55, and has an inclination of 90 degrees from the {0001} plane of the second grown crystal 50. Therefore, there is no need to make the second growth crystal 50 relatively long, so it is possible to fabricate the third seed crystal 6 with relatively short time and low costs. As a result, it is possible to reduce the time and costs for manufacturing the SiC wafer 4 having an epitaxial film.

In the example of the method, the first and second sequential growth steps are respectively carried out only once, i.e., N=2 and α=1. However, they may be carried out repeatedly. If the first sequential growth step is carried out repeatedly, so-called dislocation density in an acquired grown crystal decreases exponentially as well as the sequential growth step of the fourth embodiment. If the dislocation density is decreased enough at the first sequential growth step, a seed crystal having extremely low dislocation density is acquired using such a small angle as y at the second sequential growth step.

Sixth Embodiment

In a sixth embodiment, an SiC wafer having an epitaxial film is manufactured using a {1-100} plane as a film deposition surface. A second grown crystal 20 is formed in the same manner as the first embodiment. An SiC single crystal wafer 73, in which a {1-100} plane is exposed as a film deposition surface 735, is formed by sawing the second grown crystal 20 in the same manner as the fourth embodiment. The film deposition surface 735 of the SiC single crystal wafer 73 is treated with the surface treatments as the fourth embodiment. An SiC wafer 4 having an epitaxial film is formed by depositing an epitaxial film 730 on the film deposition surface 735 of the SiC single crystal wafer 73 using CVD method. In the sixth embodiment as well, it is possible to provide an SiC wafer having an epitaxial film that includes a relatively small number of dislocations and defects.

Seventh Embodiment

In a seventh embodiment, an SiC wafer having an epitaxial film is manufactured using a {11-20} plane as a film deposition surface. A second grown crystal 20 is formed in the same manner as the first embodiment. An SiC single crystal wafer 73, in which a {11-20} plane is exposed as a film deposition surface 735, is formed from the second grown crystal 20 by sawing in the same manner as the fourth embodiment. The film deposition surface 735 of the SiC single crystal wafer 73 is treated with the same surface treatments as the fourth embodiment. An SiC wafer 4 having an epitaxial film is formed by depositing an epitaxial film 730 on the film deposition surface 735 of the SiC single crystal wafer 73 using CVD method. In this embodiment as well, it is possible to provide an SiC wafer having an epitaxial film that includes a relatively small number of dislocations and defects.

Eighth Embodiment In an eighth embodiment, an SiC wafer having an epitaxial film is manufactured using physical vapor epitaxy (PVE) method. An SiC single crystal wafer 73 is formed from a second grown crystal 20 such that a plane having an inclination of 5 degrees from a {0001} plane of the second grown crystal 20 is exposed as a film deposition surface 735 in the same manner as the fourth embodiment. The film deposition surface 735 is treated with the same surface treatments as the fourth embodiment. An SiC wafer 4 having an epitaxial film is formed by depositing an epitaxial film 730 on the film deposition surface 735 of the SiC single crystal wafer 73 using PVE method.

Specifically, the SiC single crystal wafer 73 and a plate made of highly pure polycrystalline SiC are placed in a graphite crucible coated with TaC such that they confront each other, and the crucible is heated at about 1800° C. in an inert low pressure atmosphere using Ar gas with 100 Pa atmosphere pressure. At that time, a temperature gradient of 5 to 10° C./cm is used such that the temperature of the SiC single crystal wafer 73 is lower than that of the plate made of highly pure polycrystalline SiC. In the eighth embodiment as well, it is possible to provide an SiC wafer having an epitaxial film that includes a relatively small number of dislocations and defects.

Ninth Embodiment

In a ninth embodiment, an SiC wafer having an epitaxial film is manufactured using liquid phase epitaxy (LPE) method. An SiC single crystal wafer 73 is formed from a second grown crystal 20 such that a plane having an inclination of 5 degrees from a {0001} plane of the second grown crystal 20 is exposed as a film deposition surface 735 in the same manner as the fourth embodiment. The film deposition surface 735 is treated with the same surface treatments as the fourth embodiment. An SiC wafer 4 having an epitaxial film is formed by depositing an epitaxial film 730 on the film deposition surface 735 of the SiC single crystal wafer 73 using LPE method. Specifically, the SiC single crystal wafer 73 is fixed at the bottom of a highly pure graphite crucible that includes impurities less than 1 ppm. Then, highly pure Si powder that includes impurities less than 10 ppb is packed in the crucible, and the crucible is heated at 1800° C. in an inert high pressure atmosphere using Ar gas with 1.0 MPa atmosphere pressure. In the ninth embodiment as well, it is possible to provide an SiC wafer having an epitaxial film that includes a relatively small number of dislocations and defects.

Tenth Embodiment

In a tenth embodiment, an SiC wafer having an epitaxial film that contains nitrogen in the epitaxial film as an impurity is manufactured. An SiC single crystal wafer 73 is formed from a second grown crystal 20 such that a {0001} plane of the second grown crystal 20 is exposed as a film deposition surface 735 in the same manner as the fourth embodiment. The film deposition surface 735 is treated with the same surface treatments as the fourth embodiment. Then, at a film deposition step, $N_2$ gas is introduced at a flow rate of 0.5 ml/min (0.5 sccm) when an epitaxial film 730 is deposited by CVD method in the same manner as the fourth embodiment. In this way, an SiC wafer 4 having the epitaxial film 730 that contains nitrogen as an impurity is manufactured. The concentration of the impurity contained in the epitaxial film 730 is $1.5 \times 10^{16}/cm^3 - 1 \times 10^{18}/cm^3$. In the tenth embodiment as well, it is possible to provide an SiC wafer having an epitaxial film that includes a relatively small number of dislocations and defects.

Eleventh Embodiment

In an eleventh embodiment, an SiC wafer having an epitaxial film that contains aluminum in the epitaxial film as an impurity is manufactured. An SiC single crystal wafer 73 is formed from a second grown crystal 20 such that a {0001} plane of the second grown crystal 20 is exposed as a film deposition surface 735 in the same manner as the fourth embodiment. The film deposition surface 735 is treated with the same surface treatments as the fourth embodiment. Then, at a film deposition step, $(CH_3)_3Al$ gas is introduced at a flow rate of 0.01 ml/min (0.01 sccm) when an epitaxial film 730 is deposited by CVD method in the same manner as the fourth embodiment. The concentration of the impurity contained in the epitaxial film 730 is $1 \times 10^{18}/cm^3 - 2 \times 10^{18}/cm^3$. In this way, an SiC wafer 4 having the epitaxial film 730 that contains aluminum as an impurity is manufactured. In the eleventh embodiment as well, it is possible to provide an SiC wafer having an epitaxial film that includes a relatively small number of dislocations and defects.

Twelfth Embodiment

In a twelfth embodiment, an SiC wafer having an epitaxial film that contains boron in the epitaxial film as an impurity is manufactured. An SiC single crystal wafer 73 is formed from a second grown crystal 20 such that a {0001} plane of the second grown crystal 20 is exposed as a film deposition surface 735 in the same manner as the fourth embodiment. The film deposition surface 735 is treated with the same surface treatments as the fourth embodiment. Then, at the film deposition step, $B_2H_6$ gas is introduced at a flow rate of 0.001 ml/min (0.001 sccm) when an epitaxial film is deposited by CVD method in the same manner as the fourth embodiment. The concentration of the impurity contained in the epitaxial film 730 is $2 \times 10^{18}/cm^3 - 3 \times 10^{18}/cm^3$. In this way, an SiC wafer 4 having the epitaxial film 730 that contains boron as an impurity is manufactured. In the embodiment as well, it is possible to provide an SiC wafer having an epitaxial film that includes a relatively small number of dislocations and defects.

Thirteenth Embodiment

Figure 12:
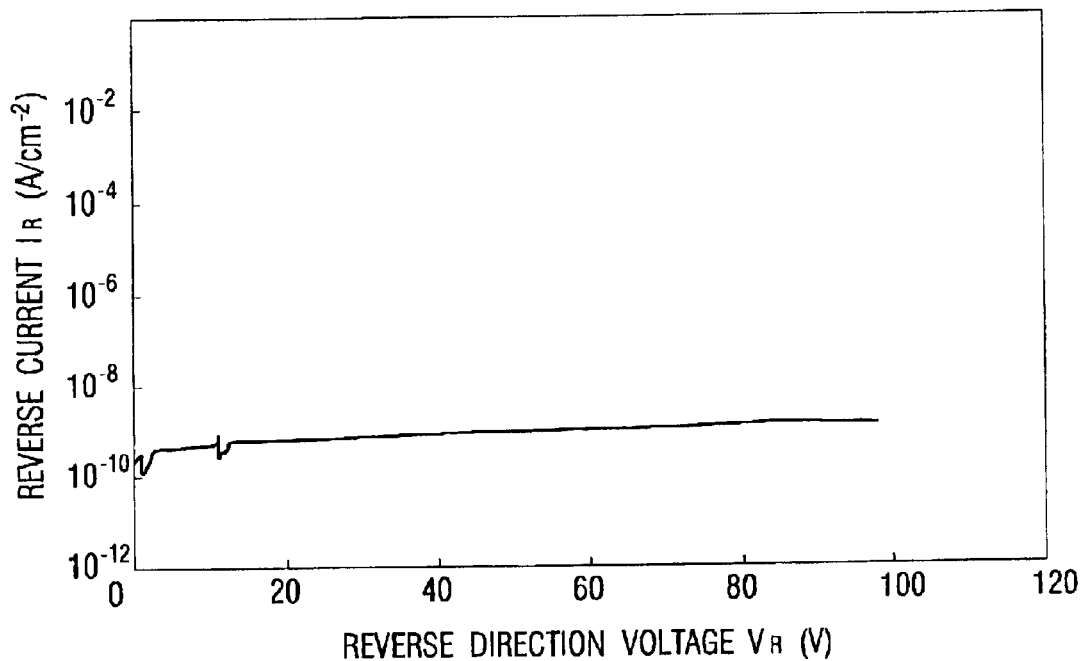
FIG. 12 is a graph showing the current-voltage characteristics in the reverse direction of an electronic device using the SiC wafer having an epitaxial film according to the thirteenth embodiment.
Figure 13:
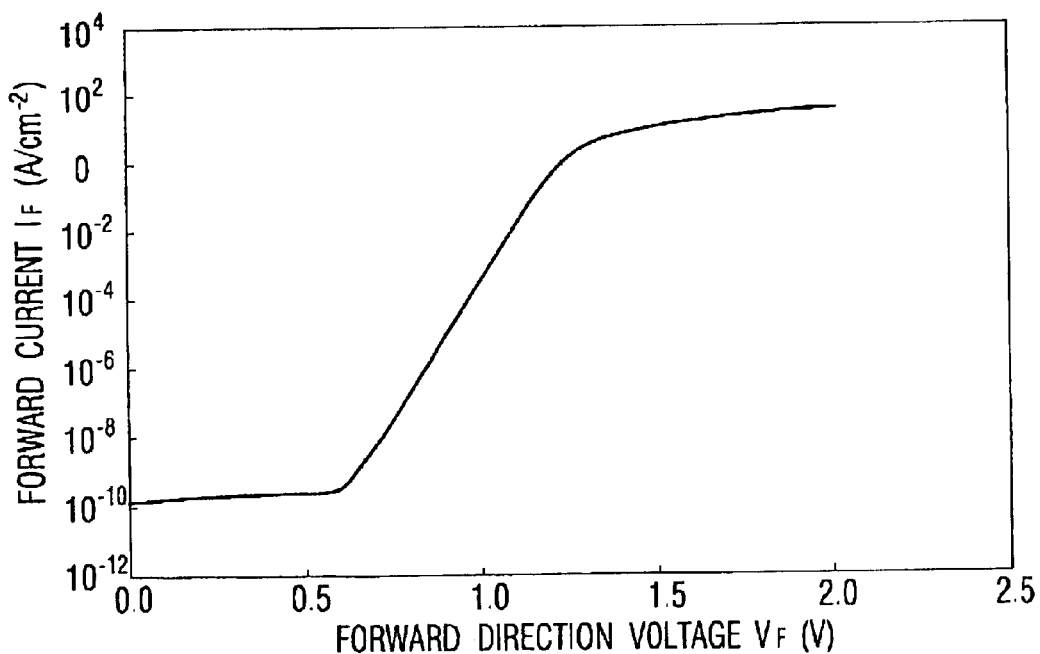
FIG. 13 is a graph showing the current-voltage characteristics in the forward direction of an electronic device using the SiC wafer having an epitaxial film according to the thirteenth embodiment.

In a thirteenth embodiment, a Schottky barrier diode is manufactured using the SiC wafer 4 having the epitaxial film 730 of the fourth embodiment. An SiC wafer 4 having an epitaxial film 730 is made in the same manner as the fourth embodiment. Then, a Schotty barrier diode is made using the SiC wafer 4. Specifically, Ni is deposited by vaporization and thermally treated at 900° C. in a vacuum atmosphere to form an electrode having ohmic contact. Next, another electrode is formed by vaporization to make a Schottky junction. The current-voltage characteristics in the reverse and forward directions of the Schotty barrier diode were measured. The results are shown in FIGS. 12 and 13. FIGS. 12 and 13 show the current-voltage characteristics in the reverse and forward directions, respectively. As shown by FIG. 12, the reverse current $I_R$, which is a leak current in the reverse direction of the Schotty barrier diode, is as small as $10^{-8}$ $A/cm^{-2}$ or less at a reverse direction voltage $V_R$ lower than 100V. On the other hand, as shown by FIG. 13, the forward current $I_F$ rises steeply, that is, the ON resistance is extremely low. Therefore, the SiC wafer 4 having the epitaxial film 730 enables to provide a quality electronic device.

Fourteenth Embodiment

As shown in FIGS. 14 to 18, a refined SiC single crystal is formed in a fourteenth embodiment. The method for forming the refined SiC single crystal includes N steps of growth, and each growth step is expressed in an n growth step, in which n is an ordinal number corresponding to a natural number from one to N. In the fourteenth embodiment, an inclination direction of a growth surface is defined as the direction of a vector that is made by projecting the normal line vector of the growth surface onto a {0001} plane of a grown crystal, from which the growth surface is exposed.

Figure 14:
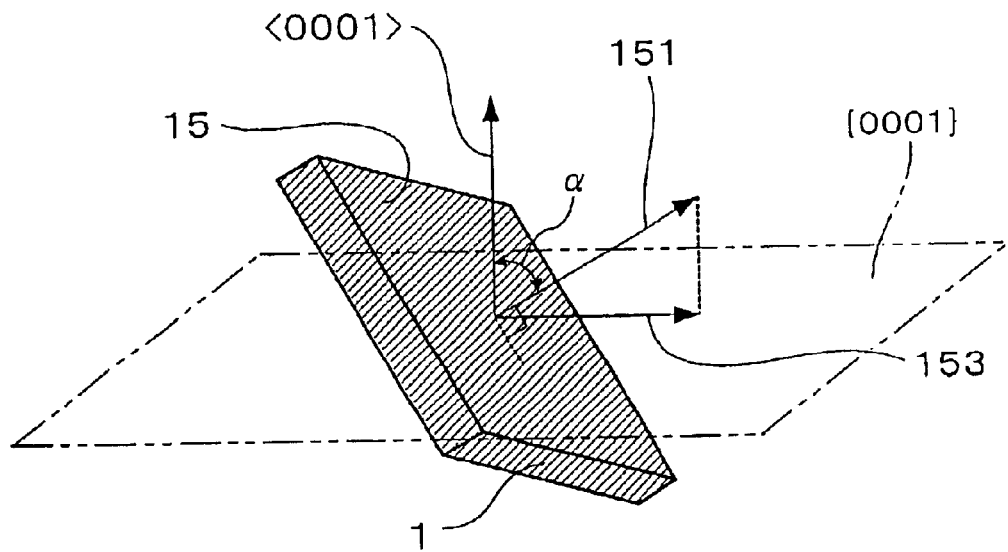
FIG. 14 is a schematic perspective view showing the plane direction of a first growth surface of the fourteenth to eighteenth embodiments.
Figure 15:
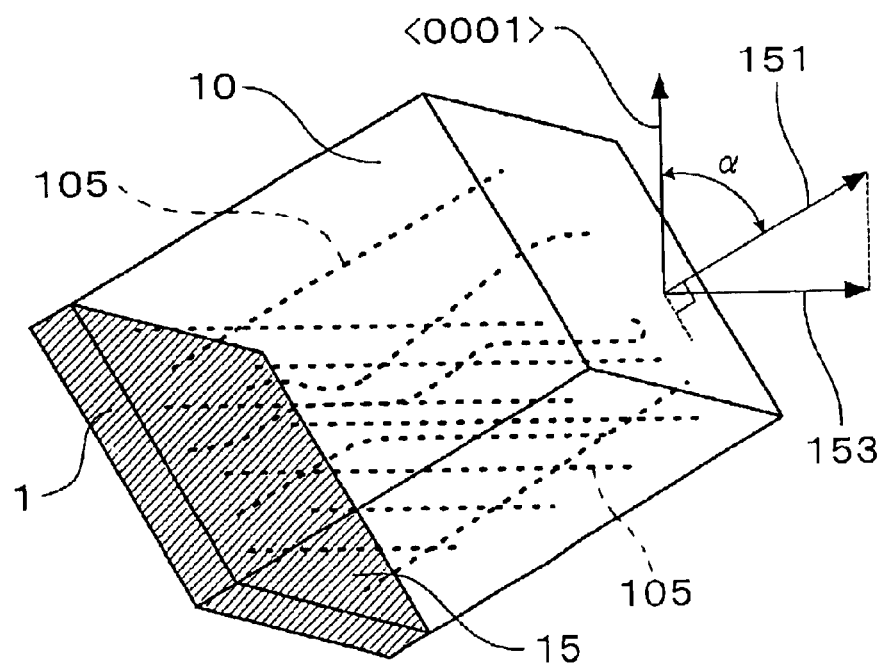
FIG. 15 is a schematic perspective view showing the direction of growth and the orientation of dislocations in a first grown crystal of the fourteenth to eighteenth embodiments.

An example of the method, in which N=2, is as follows. As shown in FIG. 14, at a first growth step, i.e., at n=1, a first seed crystal 1 is formed from a crude SiC single crystal such that a plane having an inclination of a degrees from a {0001} plane of the crude SiC single crystal and a first inclination direction 153 parallel to a <11-20> direction of the crude SiC single crystal is exposed as a first growth surface 15, and a first grown crystal 10 is formed by growing an SiC single crystal on the first growth surface 15, as shown in FIG. 15.

Figure 16:
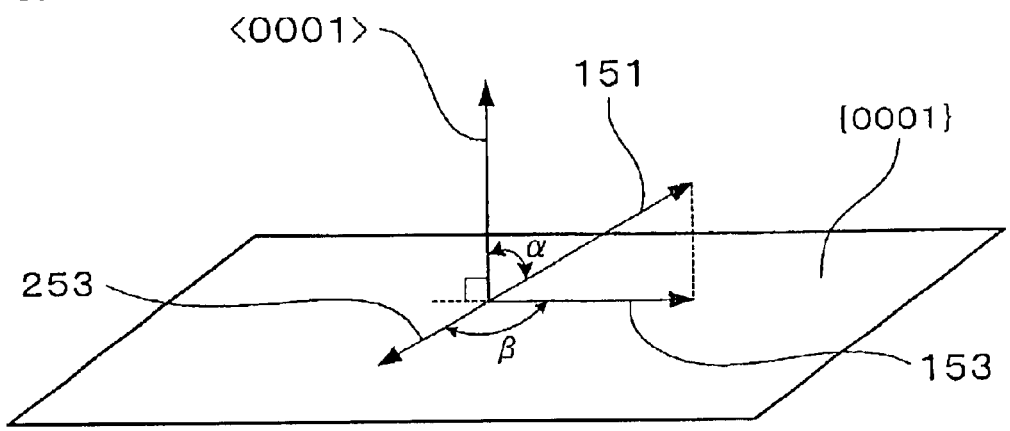
FIG. 16 is a schematic perspective view showing a first inclination direction and a second inclination direction of the fourteenth to eighteenth embodiments.
Figure 17:
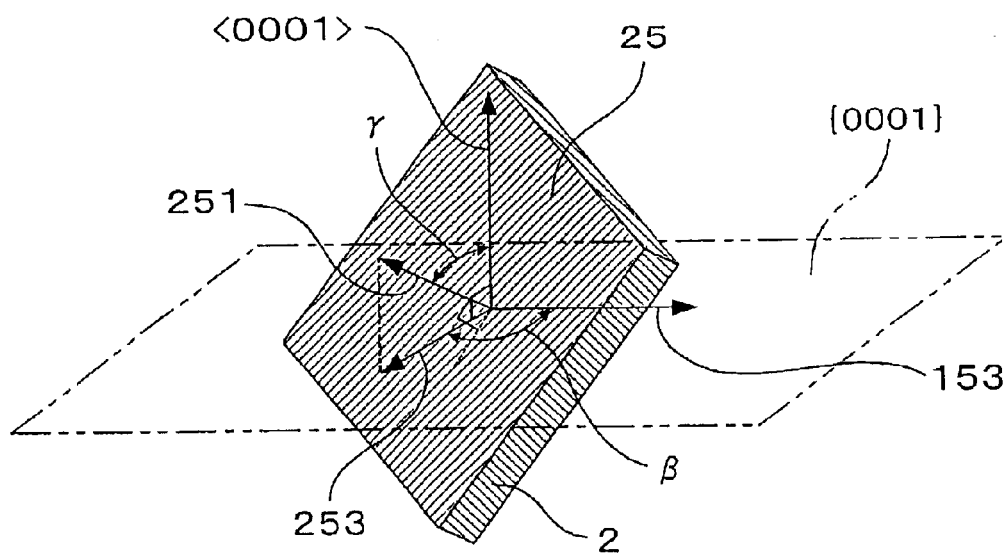
FIG. 17 is a schematic perspective view showing the plane direction of a second growth surface of the fourteenth to eighteenth embodiments.
Figure 18:
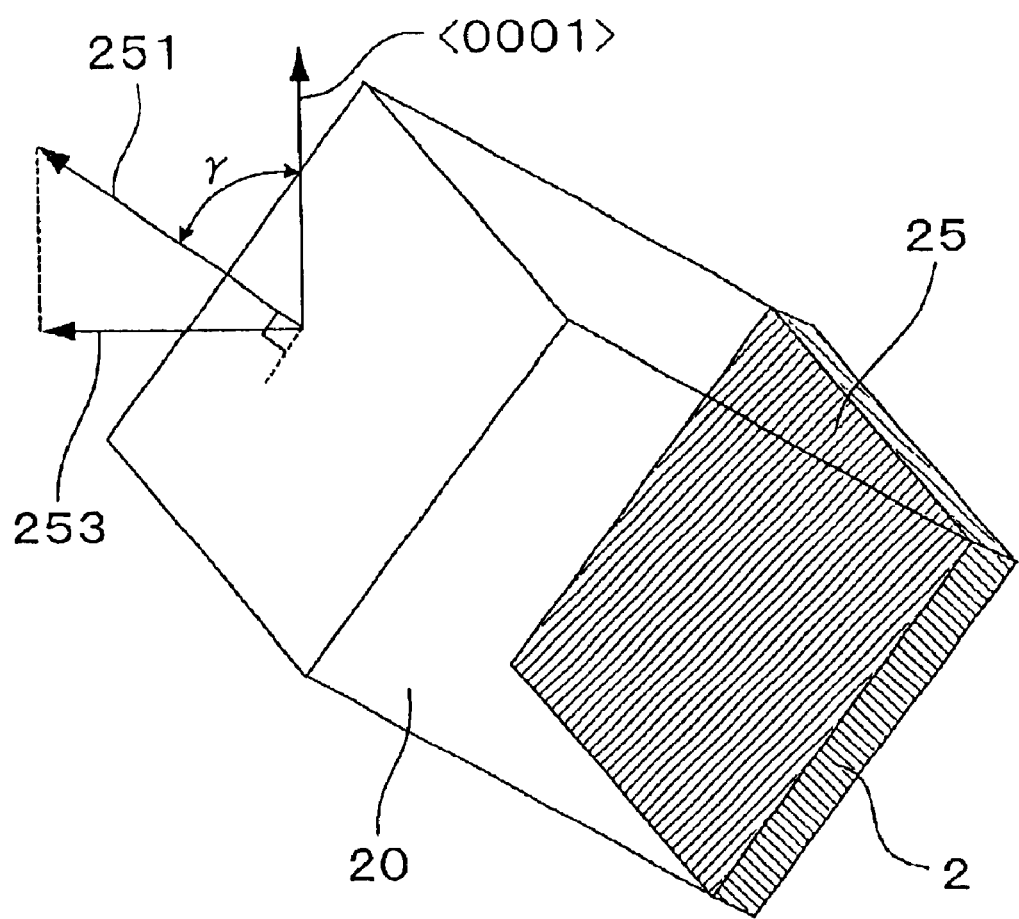
FIG. 18 is a schematic perspective view showing the direction of growth in a second grown crystal of the fourteenth to eighteenth embodiments.

Then, as shown in FIGS. 16 and 17, at a sequential growth step, i.e., at n=2, a second seed crystal 2 is formed from the first grown crystal 10 such that a second growth surface 25 has a second inclination direction 253 that is parallel to a <1-100> direction, which is the direction that is made by rotating the first inclination direction 153 parallel to a <11-20> direction by β degrees around a <0001> direction as the rotation axis in the first grown crystal 10, and has an inclination of γ degrees from a {0001} plane of the first grown crystal 10. Then, as shown in FIG. 18, the second grown crystal 20 is formed by growing an SiC single crystal on the second growth surface 25 of the second seed crystal 2.

The example of the method will be described in detail. Firstly, a crude SiC single crystal is formed by sublimation-reprecipitation technique. As sown in FIG. 14, the crude SiC single crystal is sawed such that a plane having an inclination of 60 degrees, i.e., α=60, from a {0001} plane of the crude SiC single crystal and a first inclination direction 153 parallel to a <11-20> direction of the crude SiC single crystal is exposed as a first growth surface 15. The first growth surface 15 is processed and polished. Next, the first growth surface 15 is chemically cleansed to remove foreign objects, and in-process damaged layers due to the sawing and the polishing are eliminated by RIE and sacrificial oxidization to make a first seed crystal 1, which has a thickness of 2 mm.

Subsequently, a first grown crystal 10 is formed by sublimation-reprecipitation technique in the same manner as in the first embodiment. As shown in FIG. 15, there are many dislocations 105, each of which has a Burger's vector parallel or perpendicular to a <0001> direction of the first grown crystal 10, in the first grown crystal 10. The dislocations 105 are generated by the defects exposed on the first growth surface 15 of the first seed crystal 1. Almost all dislocations 105 are parallel to the first inclination direction 153.

Then, as shown in FIGS. 16 and 17, the second seed crystal 2 is formed in the same manner as the first seed crystal 1 such that a second growth surface 25 has a second inclination direction 253 that is parallel to a <1-100> direction, which is the direction that is defined by rotating the first inclination direction 153 parallel to a <11-20> direction by 90 degrees, i.e., β=90, around the <0001> direction as the rotation axis in the first grown crystal 10, and has an inclination of 60 degrees, i.e., γ=60, from a {0001} plane of the first grown crystal 10. The second seed crystal 2 is processed to have a thickness of 2 mm.

Subsequently, a second grown crystal 20 is formed by sublimation-reprecipitation technique in the same manner as in the first embodiment. The second growth crystal 20 is formed by growing an SiC single crystal on the second growth surface 25, on which a relatively small number of defects are exposed. Therefore, the second grown crystal 20 also includes a relatively small number of dislocations and defects. The density of the defects contained in an SiC single crystal that is formed by the example of the method was measured. A c-plane substrate made from the SiC single crystal was etched with molten KOH, and the number of etch pits generated by the etching was counted. It turned out that the number of pits corresponding to dislocations was as small as $5 \times 10^2$ to $1 \times 10^3 / cm^2$.

At the first growth step of the example of the method, the first seed crystal 1 is formed such that a plane having an inclination of 60 degrees from a {0001} plane is exposed as the first growth surface 15, and the first grown crystal 10 is formed by growing an SiC single crystal on the first growth surface 15 of the first seed crystal 1. Therefore, many dislocations 105, which are inherited from the first growth surface 15, exist in the first grown crystal 10. However, it is possible to orient most dislocations 105 to be parallel to the first inclination direction 153, which is the direction of the vector that is defined by projecting the normal line vector 151 of the first growth surface 15 onto the {0001} plane.

At the second growth step, the second seed crystal 2 is formed in the same manner as the first seed crystal 1 such that the second growth surface 25 has the second inclination direction 253 and has an inclination of 60 degrees from the {0001} plane of the first grown crystal 10. Therefore, when the second growth surface 25 is exposed from the first growth crystal 10, a relatively small number of dislocations 105 are exposed on the second growth surface 25. As described above, the reason is that most dislocations 105 in the first grown crystal 10 are parallel to the first inclination direction 153, so the probability that the dislocations 105 are exposed on the second growth surface 25 is lowered.

The second growth crystal 20 is formed as a final SiC single crystal by growing an SiC single crystal on the second growth surface 25 of the second seed crystal 2, as shown in FIG. 18. As described above, a relatively small number of dislocations and defects are exposed on the second growth surface 25, so the second grown crystal 20 has a relatively small number of dislocations and defects.

In the example of the method, foreign objects and in-process damaged layers are eliminated before each SiC single crystal is formed on the first growth surface 15 and the second growth surface 25. Therefore, it is possible to prevent the dislocations otherwise caused by the foreign objects and the in-process damaged layers from being generated in each grown crystal 10, 20. Each seed crystal 1, 2 has a thickness of 1 mm or greater. Therefore, when the grown crystals 10, 20 are formed by the sublimation-reprecipitation technique, it is possible to prevent the dislocations and defects that are generated in the grown crystals 10, 20 due to the stress caused by the difference in thermal expansion between each seed crystal 1, 2 and a lid 85 that contacts the seed crystals 1, 2 as shown in FIG. 5.

According to the fourteenth embodiment, it is possible to provide a quality SiC single crystal that includes a relatively small number of defects and dislocations and a method for manufacturing the SiC single crystal.

Fifteenth Embodiment

A fifteenth embodiment is the same as the example of the method of the fourteenth embodiment except that an SiC single crystal is manufactured with the inclination angle γ changed from 60 degrees to 90 degrees at the second growth step of the fourteenth embodiment. At first, a crude SiC single crystal is prepared in the same manner as in the fourteenth embodiment. A first seed crystal 1, which has a thickness of 2 mm, is formed from the crude SiC single crystal in the same manner as in the fourteenth embodiment. A first grown crystal 10 is formed in the same manner as in the fourteenth embodiment.

Then, as shown in FIGS. 16 and 17, a second seed crystal 2 is formed in the same manner as the first seed crystal 1 such that a second growth surface 25 has a second inclination direction 253 that is parallel to a <1-100> direction, which is the direction that is defined by rotating a first inclination direction 153 parallel to a <11-20> direction by 90 degrees around a <0001> direction as the rotation axis in the first grown crystal 10, and has an inclination of 90 degrees from a {0001} plane of the first grown crystal 10. Then, a second grown crystal 20 is formed by growing an SiC single crystal on the second growth surface 25 of the second seed crystal 2, as shown in FIG. 18. In the fifteenth embodiment as well, a quality SiC single crystal having a relatively small number of defects and dislocations is provided.

Sixteenth Embodiment

A sixteenth embodiment is the same as the example of the method of the fourteenth embodiment except that a refined SiC single crystal is manufactured with the inclination angles α and γ respectively changed from 60 degrees to 90 degrees at the first and second growth steps of the fourteenth embodiment. At first, a crude SiC single crystal is prepared in the same manner as in the fourteenth embodiment. Then, the crude SiC single crystal is sawed such that a plane having an inclination of 90 degrees from a {0001} plane of the crude SiC single crystal and a first inclination direction 153 parallel to a <11-20> direction of the crude SiC single crystal is exposed as a first growth surface 15. The first growth surface 15 is processed and polished. Next, in the same manner as in the fourteen embodiment, the first growth surface 15 is chemically cleansed to remove foreign objects, and the in-process damaged layers due to the sawing and the polishing are eliminated by RIE and sacrificial oxidization to make the first seed crystal 1, which has a thickness of 2 mm. Then, a first grown crystal 10 is formed in the same manner as in the fourteenth embodiment.

Then, as shown in FIGS. 16 and 17, a second seed crystal 2 is formed in the same manner as the first seed crystal 1 such that a second growth surface 25 has a second inclination direction 253 that is parallel to a <1-100> direction, which is the direction that is defined by rotating a first inclination direction 153 parallel to a <11-20> direction by 90 degrees around a <0001> direction as the rotation axis in the first grown crystal 10, and has an inclination of 90 degrees from a {0001} plane of the first grown crystal 10. Then, a second grown crystal 20 is formed by growing an SiC single crystal on the second growth surface 25 of the second seed crystal 2, as shown in FIG. 18. In the sixteenth embodiment as well, a quality SiC single crystal having a relatively small number of defects and dislocations is provided.

Seventeenth Embodiment

A seventeenth embodiment is the same as the example of the method of the fourteenth embodiment except that a final SiC single crystal is manufactured by repeating the growth step four times, i.e., N=4. At first, a crude SiC single crystal is prepared in the same manner as in the fourteenth embodiment. Then, a first seed crystal 1 is formed from the crude SiC single crystal in the same manner as in the fourteenth embodiment such that a plane having an inclination of 90 degrees from a {0001} plane of the crude SiC single crystal and a first inclination direction 153 parallel to a <11-20> direction of the crude SiC single crystal is exposed as a first growth surface 15. A first grown crystal 10 is formed by growing an SiC single crystal on the first growth surface 15 of the first seed crystal 1.

Then, at a second growth step, i.e., at n=2, a second seed crystal 2 is formed from the first grown crystal 10 in the same manner as in the fourteenth embodiment such that a second growth surface 25 has a second inclination direction 253 that is parallel to a <1-100> direction, which is the direction that is defined by rotating the first inclination direction 153 parallel to a <11-20> direction by 90 degrees around a <0001> direction as the rotation axis in the first grown crystal 10, and has an inclination of 90 degrees from a {0001} plane of the first grown crystal 10. Then, a second grown crystal 20 is formed by growing an SiC single crystal on the second growth surface 25 of the second seed crystal 2.

Then, at a third growth step, i.e., at n=3, a third seed crystal, which has a thickness of 2 mm, is formed in the same manner as the second seed crystal 2 such that a third growth surface has a third inclination direction that is parallel to a <11-20> direction, which is the direction that is defined by rotating the second inclination direction 253 parallel to a <1-100> direction by 90 degrees around a <0001> direction as the rotation axis in the second grown crystal 20, and has an inclination of 3 degrees from a {0001} plane of the second grown crystal 20. Then, a third grown crystal is formed by growing an SiC single crystal on the third growth surface of the third seed crystal in the same manner as the first and second grown crystals. The third grown crystal includes a relatively small number of micropipe defects, dislocations, and so on.

Then, at fourth growth step, i.e., at n=4, a fourth seed crystal, which has a thickness of 2 mm, is formed in the same manner as the third seed crystal such that a fourth growth surface has a fourth inclination direction that is parallel to a <1-100> direction, which is the direction that is defined by rotating the third inclination direction parallel to a <11-20> direction by 90 degrees around a <0001> direction as the rotation axis in the third grown crystal, and has an inclination of 3 degrees from a {0001} plane of the third grown crystal. Then, a fourth grown crystal is formed by growing an SiC single crystal on the fourth growth surface of the fourth seed crystal in the same manner as the first, second, and third seed crystals. The fourth grown crystal includes a relatively small number of micropipe defects, dislocations, and so on.

Eighteenth Embodiment

In an eighteenth embodiment, an SiC wafer having an epitaxial film is manufactured using an SiC single crystal according to the sixteenth embodiment.

As first, a quality SiC single crystal 20, which is provided according to the sixteenth embodiment, is prepared. Three types of SiC single crystal wafers are formed from the SiC single crystal 20. The wafers respectively have a surface having an inclination of 5 degrees from a {0001} plane in a <11-20> direction, a surface parallel to a {1-100} plane, and a surface parallel to a {11-20} plane as an exposed film deposition surface 735. The exposed film deposition surfaces 735 of the SiC single crystal wafers are treated with surface treatments such as processing, polishing, chemical cleansing, RIE, and sacrificial oxidization in the same manner as the first seed crystal of the fourteenth embodiment.

As shown in FIG. 8, the SiC wafer 4 with an epitaxial film is formed by depositing an epitaxial film 730 on the film deposition surface 735 using CVD method. Specifically, the deposition is carried out while $SiH_4$ gas and $C_3H_8$ gas, which are raw material gases, and $H_2$ gas, which is a carrier gas, are respectively introduced into a reaction tube at 5 ml/min, 5 ml/min, and 10 l/min and while the temperature of the susceptor holding the SiC wafers and the atmosphere pressure are respectively retained at 1550° C. and 10 kPa. The density of defects such as micropipe defects, dislocation, and inclusion is relatively small in the epitaxial film 730, so a quality SiC wafer 4 with an epitaxial film can be provided.

In the method of fourteenth embodiment, at the first growth step, i.e., n=1, the first seed crystal 1 is formed such that a plane having an inclination of 1 to 90 degrees from a {0001} plane is exposed as the first growth surface 15, and the first grown crystal 10 is formed by growing an SiC single crystal on the first growth surface 15. Therefore, many dislocations exist in the first grown crystal 10. The origin of the dislocations is mainly defects that are exposed on the first growth surface 15. However, at the first growth step, it is possible to orient the directions of most dislocations to be parallel to the first inclination direction 151.

Then, at the sequential growth step, i.e., n=2, 3, . . . , or N, an n seed crystal is formed from an (n−1) grown crystal such that an n growth surface has an n inclination direction that points the direction that is made by rotating an (n−1) inclination direction by 30 to 150 degrees around a <0001> direction as the rotation axis and such that the n growth surface has an inclination of 1 to 90 degrees from a {0001} plane. Then, an n grown crystal is formed by growing an SiC single crystal on the n growth surface of the n seed crystal. Therefore, the dislocations that exist in the (n−1) grown crystal are hardly exposed on the n growth surface. The reason is that most dislocations in the (n−1) grown crystal are parallel to the (n−1) inclination direction, so the probability that the dislocations are exposed on then growth surface is lowered. Thus, then grown crystal inherits a relatively small number of dislocations from the n growth surface, that is, a relatively small number of defects exist in the n grown crystal. The sequential growth step may be carried out only once, i.e., N=2 or repeatedly. As in the seventeenth embodiment, as the number of the sequential growth steps is increased, so-called dislocation density of an acquired grown crystal decreases exponentially.

According to the method of fourteenth embodiment, it is possible to provide a quality SiC single crystal that includes a relatively small number of micropipe defects, screw dislocations, edge dislocations, and stacking faults and to provide a method for manufacturing the SiC single crystal. In addition, according to the eighteenth embodiment, it is possible to provide a quality SiC wafer having an epitaxial film that includes a relatively small number of micropipe defects, screw dislocations, edge dislocations, and stacking faults and to provide a method for manufacturing the SiC wafer.

As described above, the SiC single crystal manufactured using the method of the fourteenth embodiment includes a relatively small number of micropipe defects, screw dislocations, edge dislocations, and stacking faults. Therefore, a relatively small number of defects and dislocations are exposed on the film deposition surface of an SiC single crystal wafer that is formed from the SiC single crystal, so the epitaxial film that is formed on the SiC single crystal wafer also includes a relatively small number of the defects and dislocations. Therefore, an SiC electronic device, in which an SiC wafer including the SiC single crystal wafer and the epitaxial film is used, is excellent in the aspect that ON resistance is relatively low and leak current is relatively small.

In the method of the fourteenth embodiment, the first growth surface 15 has an inclination of 1 to 90 degrees from a {0001} plane at the first growth step. If the inclination is smaller than 1 degree, the inclination is so small that the first grown crystal substantially becomes so-called c-plane grown crystal and micropipe defects, screw dislocations, edge dislocations, stacking faults, and so on are densely generated. In addition, the n inclination direction points the direction that is defined by rotating the (n−1) inclination direction by 30 to 150 degrees around a <0001> direction as the rotation axis at the sequential growth step. If the rotation angle is smaller than 30 degrees, the probability that the dislocations included in the (n−1) grown crystal are exposed on the n growth surface becomes so high that the dislocations included in the n grown crystal are hardly reduced even if the sequential growth step is carried out repeatedly. Therefore, the rotation angle is further preferably 60 degrees or greater. The same happens in the case that the rotation angle is greater than 135 degrees, so the rotation angle is further preferably 120 degrees or smaller.

Moreover, in the method of the fourteenth embodiment, it is preferred that the n inclination direction point the direction that is defined by rotating the (n−1) inclination direction by 90 degrees around a <0001> direction as the rotation axis at one sequential growth step or more. That way, the probability that the dislocations included in the (n−1) grown crystal are exposed on the n growth surface becomes so little that the number of dislocations and defects generated in the n grown crystal is reduced, and as the number of sequential growth steps is increased, the dislocation density of the grown crystal decreases.

As in the fourteenth to eighteenth embodiments, it is preferred that foreign objects sticking to each growth surface 15, 25 and film deposition surface 735 and in-process damaged layers located in the surfaces 15, 25, 735 be eliminated before each SiC single crystal is formed on the surfaces 15, 25, 735. That way, it is possible to prevent dislocations from being generated in each grown crystal 10, 20 and an epitaxial film 730 by the foreign objects and the in-process damaged layers.

In the method of the fourteenth embodiment, it is preferred that the n growth surface at n=1, 2, . . . , or N have an inclination smaller than 70 degrees from a {0001} plane. That way, there is no need to grow a long crystal, so the costs can be reduced. In addition, it is more preferred that the n growth surface at n=1, 2, . . . , or N have an inclination of 10 degrees or greater from the {0001} plane. That way, it is possible to reduce more efficiently piercing defects such as micropipe defects, screw dislocations, and edge dislocations. If the inclination is smaller than 10 degrees, the piercing defects may be densely generated. In addition, it is more preferred that the N growth surface at n=N have an inclination of 20 degrees or smaller from the {0001} plane. That way, the final SiC single crystal is grown substantially in the direction of growth on a c-plane, and becomes so called c-plane growth crystal, which is widely used for manufacturing SiC electronic devices nowadays. Therefore, it is possible to make the SiC single crystal beneficial to manufacturing SiC electronic devices.

In the method of the fourteenth embodiment, it is preferred that an n growth surface has an inclination between 60 and 90 degrees from a {0001} plane at least one growth step except for an N growth step, at which n=N. That way, it is possible to reduce more efficiently the dislocations in the crystal. In general, in the case that a crystal is grown on a growth surface that has an inclination of 1 to 90 degrees from a {0001} plane, the directions of the dislocations generated in a grown crystal tend to become substantially parallel to the direction of the inclination. When the inclination of a growth surface is greater than 60 degrees from a {0001} plane, almost all dislocations are oriented substantially in the direction of the inclination. Therefore, by setting the inclination of a growth surface between 60 and 90 degrees from a {0001} plane, it is possible to orient almost all dislocations substantially in the direction of the inclination and it becomes easier to prevent the dislocations from being exposed on the growth surface of a seed crystal formed at the next step. On the contrary, in the case that the inclination of a growth surface is smaller than 60 degrees from a {0001} plane, dislocations that are not parallel to the direction of the inclination are exposed on the growth surface of a seed crystal formed at the next step and dislocations and defects can be generated in a grown crystal.

The growth step, at which a growth surface has an inclination between 60 and 90 degrees from a {0001} plane, can be carried out repeatedly. However, once dislocations in a crystal are reduced enough, a large inclination is not needed at a later growth step and it is possible to manufacture a sufficiently quality crystal with excellent reproducibility using an inclination as small as, for example, 1 to 20 degrees. In addition, if the inclination of a growth surface is small, there is no need to grow a long crystal at the corresponding growth step and the production costs can be reduced.

In the method of fourteenth embodiment, it is preferred that sublimation-reprecipitation technique be used for growing an SiC single crystal on each seed crystal. That way, sufficient growth height is acquired, so an SiC single crystal with a large diameter can be manufactured and a quality SiC single crystal can be manufactured with excellent reproducibility and efficiency. The method that can be used for growing the SiC single crystal in the present invention is not limited to sublimation-reprecipitation technique. Any method that can grow a single crystal ingot with sufficient growth height may be applied. For example, a chemical vapor deposition at a temperature region higher than 2000° C. may be used as disclosed in Mater. Sci. Eng. B Vol. 61–62 (1999) 113–120.

In the method of fourteenth embodiment, it is preferred that the thickness of each seed crystal be 1 mm or greater. That way, it is possible to prevent the dislocations and defects generated in a grown crystal by the stress due to the difference in thermal expansion between the seed crystal and the tool that supports the seed crystal. That is to say, it is possible to prevent the stress from distorting the lattices making up the seed crystal and generating the dislocations and defects in a grown crystal by thickening sufficiently the seed crystal. In addition, especially in the case that the growth surface of a seed crystal has an area A greater than 500 mm$^2$, the seed crystal needs to be much thicker than 1 mm. The minimum thickness tseed needed in the above case is provided by the equation, tseed=$A^{1/2} \times 2/\pi$. In the equation, the symbol $\pi$ is the circular constant.

In the eighteenth embodiment, it is preferred that the film deposition surface 735 be one of a surface that has an inclination of 0.2 to 20 degrees from a {0001} plane, a surface that has an inclination of 20 degrees or smaller from a {1-100} plane, and a surface that has an inclination of 20 degrees or smaller from a {11-20} plane. That way, it is possible to suppress the generation of micropipe defects, screw dislocations, and edge dislocations in the epitaxial film 730. In the case that the film deposition surface 735 was a surface that has an inclination smaller than 0.2 degrees from a {0001} plane, the deposition of the epitaxial film 730 might become difficult.

In the case that an SiC wafer 4 having the epitaxial film 730 is manufactured using either a surface that has an inclination of 20 degrees or smaller from a {1-100} plane or a surface that has an inclination of 20 degrees or smaller from a {11-20} plane as the film deposition surface 735, a Metal-Oxide-Semiconductor Field Effect Transistor (MOSFET) device that is manufactured using the SiC wafer 4 having the epitaxial film 730 has an extremely reduced number of interfacial levels at the interface between the oxide and the SiC single crystal of the SiC wafer 4, so the SiC wafer 4 is beneficial in manufacturing MOSFET devices.

In the eighteenth embodiment, one method of CVD, PVD, and LPE is used for depositing the epitaxial film 730. Therefore, it is possible to control readily the thickness and the impurity concentration of the epitaxial film 730. The thickness and the impurity concentration are important design parameters in the fabrication of devices using the SiC wafer 4.

In addition, it is possible to permit the epitaxial film 730 to contain the impurity at a concentration of $1 \times 10^{13}$ to $1 \times 10^{20}/cm^3$. In that case, the impurity functions as a donor or acceptor, and the SiC wafer 4 having the epitaxial film 730 can be used for a semiconductor device and soon. In the case that the concentration of the impurity is lower than $1 \times 10^{13}/cm^3$, the impurity is not able to supply sufficient carriers, so the device characteristics of the devices using the SiC wafer 4 might become unacceptable. On the other hand, in the case that the concentration of the impurity is higher than $1 \times 10^{20}/cm^3$, the impurity condenses, and as a result, dislocations and stacked faults might be generated in the epitaxial film 730.

In the eighteenth embodiment, the impurity may include one element or more of nitrogen, boron, and aluminum. In that case, it is possible to make the epitaxial film 730 become a p-type or n-type semiconductor, so the SiC wafer 4 having the epitaxial film 730 can be used for a semiconductor device such as a diode and a transistor.

What is claimed is:

1. An SiC wafer having an epitaxial film obtained by a method including N steps of growth, wherein N is a natural number equal to two or greater, wherein each growth step is expressed in an n growth step, wherein n is an ordinal number corresponding to a natural number from one to N, wherein the method comprises steps of:

forming a first seed crystal from a crude SiC single crystal such that a plane having an inclination of 20 degrees or smaller from a {1-100} plane of the crude SiC single crystal or an inclination of 20 degrees or smaller from a {11-20} plane of the crude SiC single crystal is exposed as a first growth surface at a first growth step, at which n=1;

forming a first grown crystal by growing an SiC single crystal on the first growth surface at the first growth step;

forming an n seed crystal from an (n−1) grown crystal such that an n growth surface has an inclination of 45 to 90 degrees from an (n−1) growth surface and an inclination of 60 to 90 degrees from a {0001} plane of the (n−1) grown crystal at a sequential growth step, at which n=2, 3, . . . , or N;

forming an n grown crystal by growing an SiC single crystal on the n growth surface at the sequential growth step;

forming an SiC single crystal wafer from an N grown crystal such that a film deposition surface is exposed at a film deposition step; and forming an epitaxial film on the film deposition surface at the film deposition step.

2. An SiC wafer having an epitaxial film obtained by a method including (N+α) steps of growth, wherein N is a natural number equal to two or greater, wherein α is a natural number, wherein each growth step is expressed in an n growth step, wherein n is an ordinal number corresponding to a natural number from one to (N+α), wherein the method comprises steps of:

forming a first seed crystal from a crude SiC single crystal such that a plane having an inclination of 20 degrees or smaller from a {1-100} plane of the crude SiC single crystal or an inclination of 20 degrees or smaller from a {11-20} plane of the crude SiC single crystal is exposed as a first growth surface at a first growth step, at which n=1;

forming a first grown crystal by growing an SiC single crystal on the first growth surface at the first growth step;

forming an n seed crystal from an (n−1) grown crystal such that an n growth surface has an inclination of 45 to 90 degrees from an (n−1) growth surface and an inclination of 60 to 90 degrees from a {0001} plane of the (n−1) grown crystal at a first sequential growth step, at which n=2, 3, . . . , or N;

forming an n grown crystal by growing an SiC single crystal on the n growth surface at the first sequential growth step;

forming an n seed crystal from an (n−1) grown crystal such that an n growth surface has an inclination of 0 to 45 degrees from an (n−1) growth surface and an inclination of 60 to 90 degrees from a {0001} plane of the (n−1) grown crystal at a second sequential growth step, at which n=(N+1), (N+2), . . . , or (N+α);

forming an n grown crystal by growing an SiC single crystal on the n growth surface at the second sequential growth step;

forming an SiC single crystal wafer from an (N+α) grown crystal such that a film deposition surface is exposed at a film deposition step; and forming an epitaxial film on the film deposition surface at the film deposition step.

3. An SiC wafer having an epitaxial film obtained by a method including N steps of growth, wherein N is a natural number equal to two or greater, wherein each growth step is expressed in an n growth step, wherein n is an ordinal number corresponding to a natural number from one to N, wherein an n inclination direction is defined as the direction of a vector that is made by projecting the normal line vector of an n growth surface onto a {0001} plane of an (n−1) grown crystal, wherein the method includes steps of:

forming a first seed crystal from a crude SiC single crystal such that a plane having an inclination of 1 to 90 degrees from a {0001} plane of the crude SiC single crystal is exposed as a first growth surface at a first growth step, at which n=1;

forming a first grown crystal by growing an SiC single crystal on the first growth surface of the first seed crystal;

forming an n seed crystal from an (n−1) grown crystal such that an n growth surface has an n inclination direction that points a direction that is defined by rotating an (n−1) inclination direction by 30 to 150 degrees around a <0001> direction as a rotation axis in the (n−1) grown crystal and has an inclination of 1 to 90 degrees from a {0001} plane of the (n−1) grown crystal at a sequential growth step, at which n=2, 3, . . . , or N;

forming an n grown crystal by growing an SiC single crystal on the n growth surface of the n seed crystal at the sequential growth step forming an SiC single crystal wafer from the n grown crystal such that a film deposition surface is exposed; and depositing an epitaxial film on the film deposition surface of the SiC single crystal wafer.

4. A refined SiC single crystal obtained by a method including N steps of growth, wherein N is a natural number equal to three or greater, wherein each growth step is expressed in an n growth step, wherein n is an ordinal number corresponding to a natural number from one to N, wherein the method comprises steps of:

forming a first seed crystal from a crude SiC single crystal such that a plane having an inclination of 20 degrees or smaller from a {1-100} plane of the crude SiC single crystal or an inclination of 20 degrees or smaller from a {11-20} plane of the crude SiC single crystal is exposed as a first growth surface at a first growth step, at which n=1;

forming a first grown crystal by growing an SiC single crystal on the first growth surface at the first growth step;

forming an n seed crystal from an (n−1) grown crystal such that an n growth surface has an inclination of 45 to 90 degrees from an (n−1) growth surface and an inclination of 60 to 90 degrees from a {0001} plane of the (n−1) grown crystal at an intermediate growth step, at which n=2, 3, . . . , or (N−1);

forming an n grown crystal by growing an SiC single crystal on the n growth surface at the intermediate growth step;

forming a final seed crystal from an (N−1) grown crystal such that a plane having an inclination of 20 degrees or smaller from a {0001} plane of the (N−1) grown crystal is exposed as a final growth surface at a final growth step, at which n=N; and forming a final SiC single crystal by growing an SiC single crystal on the final growth surface at the final growth step.

5. A refined SiC single crystal obtained by a method including N steps of growth, wherein N is a natural number equal to two or greater, wherein each growth step is expressed in an n growth step, wherein n is an ordinal number corresponding to a natural number from one to N, wherein an n inclination direction is defined as the direction of a vector that is made by projecting the normal line vector of an n growth surface onto a {0001} plane of an (n−1) grown crystal, wherein the method includes steps of:

forming a first seed crystal from a crude SiC crystal such that a plane having an inclination of 1 to 90 degrees from a {0001} plane of the crude SiC crystal is exposed as a first growth surface at a first growth step, at which n=1;

forming a first grown crystal by growing an SiC single crystal on the first growth surface of the first seed crystal;

forming an n seed crystal from an (n−1) grown crystal such that an n growth surface has an n inclination direction that points a direction that is defined by rotating an (n−1) inclination direction by 30 to 150 degrees around a <0001> direction as a rotation axis in the (n−1) grown crystal and has an inclination of 1 to 90 degrees from a {0001} plane of the (n−1) grown crystal at a sequential growth step, at which n=2, 3, . . . , or N; and forming an n grown crystal by growing an SiC single crystal on the n growth surface of the n seed crystal at the sequential growth step.

6. A refined SiC seed crystal obtained by a method including N steps of growth, wherein N is a natural number equal to three or greater, wherein each growth step is expressed in an n growth step, wherein n is an ordinal number corresponding to a natural number from one to (N−1), wherein the method comprises steps of:

forming a first seed crystal from a crude SiC single crystal such that a plane having an inclination of 20 degrees or smaller from a {1-100} plane of the crude SiC single crystal or an inclination of 20 degrees or smaller from a {11-20} plane of the crude SiC single crystal is exposed as a first growth surface at a first growth step, at which n=1;

forming a first grown crystal by growing an SiC single crystal on the first growth surface at the first growth step;

forming an n seed crystal from an (n−1) grown crystal such that an n growth surface has an inclination of 45 to 90 degrees from an (n−1) growth surface and an inclination of 60 to 90 degrees from a {0001} plane of the (n−1) grown crystal at an intermediate growth step, at which n=2, 3, . . . , or (N−1);

forming an n grown crystal by growing an SiC single crystal on the n growth surface at the intermediate growth step;

forming a seed crystal such that a plane having an inclination of 20 degrees or smaller from a {0001} plane of an (N−1) grown crystal is exposed as a final growth surface.

7. A method for manufacturing an SiC wafer having an epitaxial film, wherein the method includes N steps of growth, wherein N is a natural number equal to two or greater, wherein each growth step is expressed in an n growth step, wherein n is an ordinal number corresponding to a natural number from one to N, wherein the method comprises steps of:

forming a first seed crystal from a crude SiC single crystal such that a plane having an inclination of 20 degrees or smaller from a {1-100} plane of the crude SiC single crystal or an inclination of 20 degrees or smaller from a {11-20} plane of the crude SiC single crystal is exposed as a first growth surface at a first growth step, at which n=1;

forming a first grown crystal by growing an SiC single crystal on the first growth surface at the first growth step;

forming an n seed crystal from an (n−1) grown crystal such that an n growth surface has an inclination of 45 to 90 degrees from an (n−1) growth surface and an inclination of 60 to 90 degrees from a {0001} plane of the (n−1) grown crystal at a sequential growth step, at which n=2, 3, . . . , or N;

forming an n grown crystal by growing an SiC single crystal on the n growth surface at the sequential growth step;

forming an SiC single crystal wafer from an N grown crystal such that a film deposition surface is exposed at a film deposition step; and forming an epitaxial film on the film deposition surface at the film deposition step.

8. The method for manufacturing the SiC wafer having an epitaxial film in claim 7, wherein sublimation-reprecipitation technique is used for growing one of the SiC single crystals on the corresponding growth surface.

9. The method for manufacturing the SiC wafer having an epitaxial film in claim 7, wherein one of the seed crystals is formed to have a thickness of 1 mm or greater.

10. The method for manufacturing the SiC wafer having an epitaxial film in claim 7, wherein one of a surface that has an inclination of 0.2 to 20 degrees from a {0001} plane, a surface that has an inclination of 20 degrees or smaller from a {1-100} plane, and a surface that has an inclination of 20 degrees or smaller from a {11-20} plane is exposed as the film deposition surface.

11. The method for manufacturing the SiC wafer having an epitaxial film in claim 7, wherein one of CVD, PVD, and LPE methods is used for forming the epitaxial film on the film deposition surface at the film deposition step.

12. The method for manufacturing the SiC wafer having an epitaxial film in claim 7, wherein an impurity is doped in the epitaxial film at a concentration of $1 \times 10^{13}$ to $1 \times 10^{20}/cm^3$ at the film deposition step.

13. The method for manufacturing the SiC wafer having an epitaxial film in claim 12, wherein one element or more of nitrogen, boron, and aluminum is used as the impurity.

14. A method for manufacturing an SiC wafer having an epitaxial film, wherein the method includes (N+α) steps of growth, wherein N is a natural number equal to two or greater, wherein α is a natural number, wherein each growth step is expressed in an n growth step, wherein n is an ordinal number corresponding to a natural number from one to (N+α), wherein the method comprises steps of:

forming a first seed crystal from a crude Sic single crstal such that a plane having an inclination of 20 degrees or smaller from a {1-100} plane of the crude SiC single crstal or an inclination of 20 degrees or smaller from a {11-20} plane of the crude SiC single crstal is exposed as a first growth surface at a first growth step, at which n=1;

forming a first grown crystal by growing an SiC single crystal on the first growth surface at the first growth step;

forming an n seed crystal from an (n−1) grown crystal such that an n growth surface has an inclination of 45 to 90 degrees from an (n−1) growth surface and an inclination of 60 to 90 degrees from a {0001} plane of the (n−1) grown crystal at a first sequential growth step, at which n=2, 3, . . . , or N;

forming an n grown crystal by growing an SiC single crystal on the n growth surface at the first sequential growth step;

forming an n seed crystal from an (n−1) grown crystal such that an n growth surface has an inclination of 0 to 45 degrees from an (n−1) growth surface and an inclination of 60 to 90 degrees from a {0001} plane of the (n−1) grown crystal at a second sequential growth step, at which n=(N+1), (N+2), . . . , or (N+α);

forming an n grown crystal by growing an SiC single crystal on the n growth surface at the second sequential growth step;

forming an SiC single crystal wafer from an (N+α) grown crystal such that a film deposition surface is exposed at a film deposition step; and forming an epitaxial film on the film deposition surface at the film deposition step.

15. The method for manufacturing the SiC wafer having an epitaxial film in claim 14, wherein sublimation-reprecipitation technique is used for growing one of the SiC single crystals on the corresponding growth surface.

16. The method for manufacturing the SiC wafer having an epitaxial film in claim 14, wherein one of the seed crystals is formed to have a thickness of 1 mm or greater.

17. The method for manufacturing the SiC wafer having an epitaxial film in claim 14, wherein one of a surface that has an inclination of 0.2 to 20 degrees from a {0001} plane, a surface that has an inclination of 20 degrees or smaller from a {1-100} plane, and a surface that has an inclination of 20 degrees or smaller from a {11-20} plane is exposed as the film deposition surface.

18. The method for manufacturing the SiC wafer having an epitaxial film in claim 14, wherein one of CVD, PVD, and LPE methods is used for forming the epitaxial film on the film deposition surface at the film deposition step.

19. The method for manufacturing the SiC wafer having an epitaxial film in claim 14, wherein an impurity is doped in the epitaxial film at a concentration of $1 \times 10^{13}$ to $1 \times 10^{20}/$cm$^3$ at the film deposition step.

20. The method for manufacturing the SiC wafer having an epitaxial film in claim 19, wherein one element or more of nitrogen, boron, and aluminum is used as the impurity.

21. A method for manufacturing an SiC wafer having an epitaxial film, wherein the method includes N steps of growth, wherein N is a natural number equal to two or greater, wherein each growth step is expressed in an n growth step, wherein n is an ordinal number corresponding to a natural number from one to N, wherein an n inclination direction is defined as the direction of a vector that is made by projecting the normal line vector of an n growth surface onto a {0001} plane of an (n−1) grown crystal, wherein the method includes steps of:

forming a first seed crystal from a crude SiC crystal such that a plane having an inclination of 1 to 90 degrees from a {0001} plane of the crude SiC crystal is exposed as a first growth surface at a first growth step, at which n=1;

forming a first grown crystal by growing an SiC single crystal on the first growth surface of the first seed crystal;

forming an n seed crystal from an (n−1) grown crystal such that an n growth surface has an n inclination direction that points a direction that is defined by rotating an (n−1) inclination direction by 30 to 150 degrees around a <0001> direction as a rotation axis in the (n−1) grown crystal and has an inclination of 1 to 90 degrees from a {0001} plane of the (n−1) grown crystal at a sequential growth step, at which n=2, 3, . . . , or N;

forming an n grown crystal by growing an SiC single crystal on the n growth surface of the n seed crystal at the sequential growth step forming an SiC single crystal wafer from the n grown crystal such that a film deposition surface is exposed; and depositing an epitaxial film on the film deposition surface of the SiC single crystal wafer.

22. The method for manufacturing the SiC wafer having the epitaxial film in claim 21, wherein one of a surface that has an inclination of 0.2 to 20 degrees from a {0001} plane, a surface that has an inclination of 20 degrees or smaller from a {1-100} plane, and a surface that has an inclination of 20 degrees or smaller from a {11-20} plane is exposed as the film deposition surface.

23. A method for manufacturing a refined SiC single crystal, wherein the method includes N steps of growth, wherein N is a natural number equal to three or greater, wherein each growth step is expressed in an n growth step, wherein n is an ordinal number corresponding to a natural number from one to N, wherein the method comprises steps of:

forming a first seed crystal from a crude SiC single crystal such that a plane having an inclination of 20 degrees or smaller from a {1-100} plane of the crude SiC single crystal or an inclination of 20 degrees or smaller from a {11-20} plane of the crude SiC single crystal is exposed as a first growth surface at a first growth step, at which n=1;

forming a first grown crystal by growing an SiC single crystal on the first growth surface at the first growth step;

forming an n seed crystal from an (n−1) grown crystal such that an n growth surface has an inclination of 45 to 90 degrees from an (n−1) growth surface and an inclination of 60 to 90 degrees from a {0001} plane of the (n−1) grown crystal at an intermediate growth step, at which n=2, 3, . . . , or (N−1);

forming an n grown crystal by growing an SiC single crystal on the n growth surface at the intermediate growth step;

forming a final seed crystal from an (N−1) grown crystal such that a plane having an inclination of 20 degrees or smaller from a {0001} plane of the (N−1) grown crystal is exposed as a final growth surface at a final growth step, at which n=N; and forming a final SiC single crystal by growing an SiC single crystal on the final growth surface at the final growth step.

24. The method for manufacturing the refined SiC single crystal in claim 23, the method further comprising steps of:

forming a duplication seed crystal by sawing the final SiC single crystal such that a plane having an inclination of 20 degrees or smaller from a {0001} plane of the final SiC single crystal is exposed as an duplication growth surface; and forming an duplicated SiC single crystal by growing an SiC single crystal on the duplication growth surface.

25. The method for manufacturing the refined SiC single crystal in claim 23, the method further comprising a step of forming an n seed crystal from an (n−1) grown crystal such that an n growth surface has an inclination of 20 degrees or smaller from a {0001} plane of the (n−1) grown crystal at an intermediate growth step, at which n=2, 3, . . . , or (N−2).

26. The method for manufacturing the refined SiC single crystal in claim 23, the method further comprising a step of etching each surface of the seed crystals using a thermal etching or an etching gas before growing each SiC single crystal at the first growth step and the intermediate growth step, wherein the thermal etching is carried out at each growth temperature of the grown crystals or at a temperature within ±400° C. from each growth temperature, wherein etching using the etching gas is carried out by introducing an etching gas into each container used for growing the grown crystals.

27. The method for manufacturing the refined SiC single crystal in claim 23, wherein sublimation-reprecipitation technique is used for growing one of the SiC single crystals on the corresponding growth surface.

28. The method for manufacturing the refined SiC single crystal in claim 23, wherein a chemical vapor deposition using a raw material gas containing silicon and carbon is used for growing one of the SiC single crystals on the corresponding growth surface.

29. The method for manufacturing the refined SiC single crystal in claim 28, wherein the final SiC single crystal is formed to have a length greater than 50 mm in a direction of growth of the SiC single crystal grown on the final growth surface.

30. The method for manufacturing the refined SiC single crystal in claim 23, wherein one of the seed crystals is formed to have a thickness of 1 mm or greater.

31. A method for manufacturing a refined Sic single crystal, wherein the method includes N steps of growth, wherein N is a natural number equal to two or greater, wherein each growth step is expressed in an n growth step, wherein n is an ordinal number corresponding to a natural number from one to N, wherein an n inclination direction is defined as the direction of a vector that is made by projecting the normal line vector of an n growth surface onto a {0001} plane of an (n−1) grown crystal, wherein the method includes steps of:

forming a first seed crystal from a crude SiC single crystal such that a plane having an inclination of 1 to 90 degrees from a {0001} plane of the crude SiC single crystal is exposed as a first growth surface at a first growth step, at which n=1;

forming a first grown crystal by growing an SiC single crystal on the first growth surface of the first seed crystal;

forming an n seed crystal from an (n−1) grown crystal such that an n growth surface has an n inclination direction that points a direction that is defined by rotating an (n−1) inclination direction by 30 to 150 degrees around a <0001> direction as a rotation axis in the (n−1) grown crystal and has an inclination of 1 to 90 degrees from a {0001} plane of the (n−1) grown crystal at a sequential growth step, at which n=2, 3, . . . , or N; and forming an n grown crystal by growing an SiC single crystal on the n growth surface of the n seed crystal at the sequential growth step.

32. The method for manufacturing the refined SiC single crystal in claim 31, wherein each growth surface is formed to have an inclination smaller than 70 degrees from the corresponding {0001} plane.

33. The method for manufacturing the refined SiC single crystal in claim 31, wherein each growth surface is formed to have an inclination of 10 degrees or greater from the corresponding {0001} plane.

34. The method for manufacturing the refined SiC single crystal in claim 31, wherein the N growth surface is formed to have an inclination of 20 degrees or smaller from the corresponding {0001} plane at the step of forming the N seed crystal, in which n=N.

35. The method for manufacturing the refined SiC single crystal in claim 31, wherein one of the growth surfaces that are formed at the first to (N−1) growth steps is formed to have an inclination between 60 and 90 degrees from the corresponding {0001} plane.

36. The method for manufacturing the refined SiC single crystal in claim 31, sublimation-repreciptation technique is used for growing one of the SiC single crystals on the corresponding seed crystal.

37. The method for manufacturing the refined SiC single crystal in claim 31, one of the seed crystals is formed to have a thickness of 1 mm or greater.

38. A method for manufacturing a refined SiC seed crystal, wherein the method includes (N−1) steps of growth, wherein N is a natural number equal to three or greater, wherein each growth step is expressed in an n growth step, wherein n is an ordinal number corresponding to a natural number from one to (N−1), wherein the method comprises steps of:

forming a first seed crystal from a crude SiC single crystal such that a plane having an inclination of 20 degrees or smaller from a {1-100} plane of the crude SiC single crystal or an inclination of 20 degrees or smaller from a {11-20} plane of the crude SiC single crystal is exposed as a first growth surface at a first growth step, at which n=1;

forming a first grown crystal by growing an SiC single crystal on the first growth surface at the first growth step;

forming an n seed crystal from an (n−1) grown crystal such that an n growth surface has an inclination of 45 to 90 degrees from an (n−1) growth surface and an inclination of 60 to 90 degrees from a {0001} plane of the (n−1) grown crystal at an intermediate growth step, at which n=2, 3, . . . , or (N−1);

forming an n grown crystal by growing an SiC single crystal on the n growth surface at the intermediate growth step;

forming a seed crystal such that a plane having an inclination of 20 degrees or smaller from a {0001} plane of an (N−1) grown crystal is exposed as a final growth surface.

39. The method for manufacturing the refined SiC seed crystal in claim 38, the method further comprising a step of etching each surface of the seed crystals using a thermal etching or an etching gas before growing each SiC single crystal at the first growth step and the intermediate growth step, wherein the thermal etching is carried out at each growth temperature of the grown crystals or at a temperature within ±400° C. from each growth temperature, wherein etching using the etching gas is carried out by introducing an etching gas into each container used for growing the grown crystals.

40. The method for manufacturing the refined SiC seed crystal in claim 38, wherein sublimation-repreciptation technique is used for growing one of the SiC single crystals on the corresponding growth surface.

41. The method for manufacturing the refined SiC seed crystal in claim 38, one of the seed crystals is formed to have a thickness of 1 mm or greater.

42. An SiC electronic device obtained by using an SiC wafer having an epitaxial film, wherein the SiC wafer is obtained by a method including N steps of growth, wherein N is a natural number equal to two or greater, wherein each growth step is expressed in an n growth step, wherein n is an ordinal number corresponding to a natural number from one to N, wherein the method comprises steps of:

forming a first seed crystal from a crude SiC single crystal such that a plane having an inclination of 20 degrees or smaller from a {1-100} plane of the crude SiC single crystal or an inclination of 20 degrees or smaller from a {11-20} plane of the crude SiC single crystal is exposed as a first growth surface at a first growth step, at which n=1;

forming a first grown crystal by growing an SiC single crystal on the first growth surface at the first growth step;

forming an n seed crystal from an (n−1) grown crystal such that an n growth surface has an inclination of 45 to 90 degrees from an (n−1) growth surface and an inclination of 60 to 90 degrees from a {0001} plane of the (n−1) grown crystal at a sequential growth step, at which n=2, 3, . . . , or N;

forming an n grown crystal by growing an SiC single crystal on the n growth surface at the sequential growth step;

forming an SiC single crystal wafer from an N grown crystal such that a film deposition surface is exposed at a film deposition step; and forming an epitaxial film on the film deposition surface at the film deposition step.

43. An SiC electronic device obtained by using an SiC wafer having an epitaxial film, wherein the SiC wafer is obtained by a method including (N+α) steps of growth, wherein N is a natural number equal to two or greater, wherein α is a natural number, wherein each growth step is expressed in an n growth step, wherein n is an ordinal number corresponding to a natural number from one to N+α, wherein the method comprises steps of:

forming a first seed crystal from a crude SiC single crystal such that a plane having an inclination of 20 degrees or smaller from a {1-100} plane of the crude SiC single crystal or an inclination of 20 degrees or smaller from a {11-20} plane of the crude SiC single crystal is exposed as a first growth surface at a first growth step, at which n=1;

forming a first grown crystal by growing an SiC single crystal on the first growth surface at the first growth step;

forming an n seed crystal from an (n−1) grown crystal such that an n growth surface has an inclination of 45 to 90 degrees from an (n−1) growth surface and an inclination of 60 to 90 degrees from a {0001} plane of the (n−1) grown crystal at a first sequential growth step, at which n=2, 3, . . . , or N;

forming an n grown crystal by growing an SiC single crystal on the n growth surface at the first sequential growth step;

forming an n seed crystal from an (n−1) grown crystal such that an n growth surface has an inclination of 0 to 45 degrees from an (n−1) growth surface and an inclination of 60 to 90 degrees from a {0001} plane of the (n−1) grown crystal at a second sequential growth step, at which n=(N+1), (N+2), . . . , or (N+α);

forming an n grown crystal by growing an SiC single crystal on the n growth surface at the second sequential growth step;

forming an SiC single crystal wafer from an (N+α) grown crystal such that a film deposition surface is exposed at a film deposition step; and forming an epitaxial film on the film deposition surface at the film deposition step.

44. An SiC electronic device obtained by using an SiC wafer having an epitaxial film, wherein the SiC wafer is obtained by a method including N steps of growth, wherein N is a natural number equal to two or greater, wherein each growth step is expressed in an n growth step, wherein n is an ordinal number corresponding to a natural number from one to N, wherein an n inclination direction is defined as the direction of a vector that is made by projecting the normal line vector of an n growth surface onto a {0001} plane of an (n−1) grown crystal, wherein the method includes steps of:

forming a first seed crystal from a crude SiC single crystal such that a plane having an inclination of 1 to 90 degrees from a {0001} plane of the crude SiC single crystal is exposed as a first growth surface at a first growth step, at which n=1;

forming a first grown crystal by growing an SiC single crystal on the first growth surface of the first seed crystal;

forming an n seed crystal from an (n−1) grown crystal such that an n growth surface has an n inclination direction that points a direction that is defined by rotating an (n−1) inclination direction by 30 to 150 degrees around a <0001> direction as a rotation axis in the (n−1) grown crystal and has an inclination of 1 to 90 degrees from a {0001} plane of the (n−1) grown crystal at a sequential growth step, at which n=2, 3, . . . , or N;

forming an n growth crystal by growing an SiC single crystal on the n growth surface of the n seed crystal at the sequential growth step forming an SiC single crystal wafer from the n grown crystal such that a film deposition surface is exposed; and depositing an epitaxial film on the film deposition surface of the SiC single crystal wafer.

* * * * *